United States Patent
Harigai et al.

(10) Patent No.: US 8,183,748 B2
(45) Date of Patent: May 22, 2012

(54) PIEZOELECTRIC THIN FILM, INK JET HEAD, METHOD FOR FORMING IMAGE WITH THE INK JET HEAD, ANGULAR VELOCITY SENSOR, METHOD FOR MEASURING ANGULAR VELOCITY WITH THE ANGULAR VELOCITY SENSOR, PIEZOELECTRIC GENERATING ELEMENT AND METHOD FOR GENERATING ELECTRIC POWER WITH THE PIEZOELECTRIC GENERATING ELEMENT

(75) Inventors: Takakiyo Harigai, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/076,068

(22) Filed: Mar. 30, 2011

(65) Prior Publication Data

US 2011/0175012 A1 Jul. 21, 2011

Related U.S. Application Data

(63) Continuation of application No. PCT/JP2010/005744, filed on Sep. 22, 2010.

(30) Foreign Application Priority Data

Oct. 13, 2009 (JP) ................................. 2009-236373

(51) Int. Cl.
*H01L 41/08* (2006.01)

(52) U.S. Cl. ......... 310/358; 310/311; 310/370; 310/365

(58) Field of Classification Search .................. 310/370, 310/358, 311, 367, 360, 363; 73/504.16; 252/62.9 R, 62.9 PZ; *H01L 41/083*
See application file for complete search history.

(56) References Cited

U.S. PATENT DOCUMENTS 4,668,595 A * 5/1987 Yoshino et al. ............ 429/231.1
(Continued)

FOREIGN PATENT DOCUMENTS

JP    4-060073    9/1992
(Continued)

OTHER PUBLICATIONS

Lang Wu et al., "Synthesis and Properties of $[Bi_{0.5}(Na_{1-x}Ag_x)_{0.5}]_{1-y}Ba_yTiO_3$ Piezoelectric Ceramics," Japanese Journal of Applied Physics, vol. 44, No. 12, pp. 8515-8518, 2005.

(Continued)

*Primary Examiner* — Thomas Dougherty
*Assistant Examiner* — Karen B Addison
(74) *Attorney, Agent, or Firm* — McDermott Will & Emery LLP

(57) ABSTRACT

Provided is a lead-free piezoelectric thin film containing a lead-free ferroelectric material and having low dielectric loss, high electromechanical coupling coefficient and high piezoelectric constant comparable to that of lead zirconate titanate (PZT). The piezoelectric thin film of the present invention has a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01.

3 Claims, 20 Drawing Sheets

U.S. PATENT DOCUMENTS

| | | | |
|---|---|---|---|
| 5,438,231 A * | 8/1995 | Khoshnevisan et al. | 310/321 |
| 6,162,293 A | 12/2000 | Kijima et al. | |
| 7,090,785 B2 * | 8/2006 | Chiang et al. | 252/62.9 R |
| 7,101,491 B2 | 9/2006 | Nonoyama et al. | |
| 7,185,540 B2 * | 3/2007 | Torii et al. | 310/370 |
| 2006/0006360 A1 | 1/2006 | Takao et al. | |

FOREIGN PATENT DOCUMENTS

| JP | 10-182291 | 7/1998 |
|---|---|---|
| JP | 11-180769 | 7/1999 |
| JP | 2001-294482 | 10/2001 |
| JP | 2006-028001 | 2/2006 |
| JP | 2007-266346 | 10/2007 |
| JP | 2008-169113 | 7/2008 |
| JP | 2009-010367 | 1/2009 |

OTHER PUBLICATIONS

Tadashi Takenaka et al., "$(Bi_{1/2}Na_{1/2})TiO_3$-$BaTiO_3$ System for Lead-Free Piezoelectric Ceramics," Japanese Journal of Applied Physics, vol. 30, No. 9B, pp. 2236-2239, 1991.

Hong-Wei Cheng et al., "Combinatorial Studies of $(1-x)Na_{0.5}Bi_{0.5}TiO_3$-$xBaTiO_3$ thin-film chips," Applied Physics Letters, vol. 85, No. 12, pp. 2319-2321, 2004.

Z.H. Zhou et al. "Ferroelectric and electrical behavior of $(Na_{0.5}Bi_{0.5})TiO_3$ thin films," Applied Physics Letters, vol. 85, No. 5, pp. 804-806, 2004.

* cited by examiner

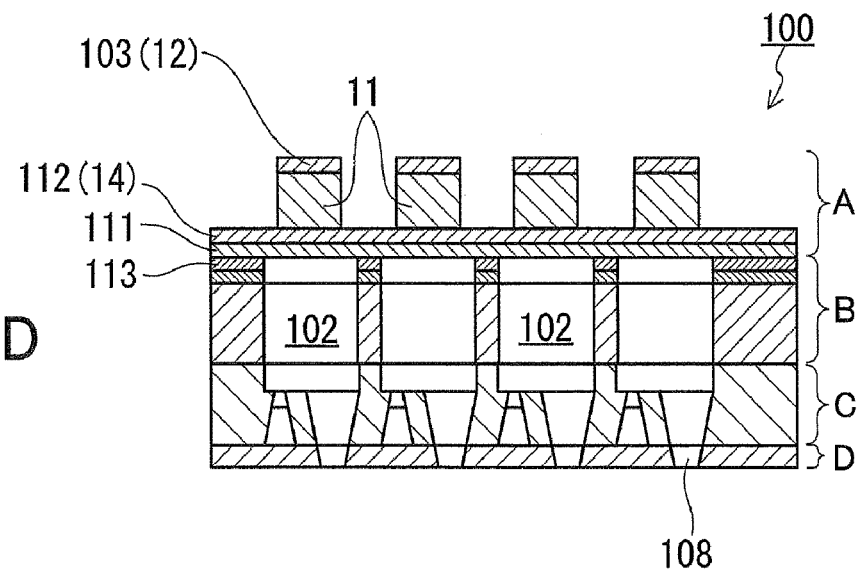

PIEZOELECTRIC THIN FILM, INK JET HEAD, METHOD FOR FORMING IMAGE WITH THE INK JET HEAD, ANGULAR VELOCITY SENSOR, METHOD FOR MEASURING ANGULAR VELOCITY WITH THE ANGULAR VELOCITY SENSOR, PIEZOELECTRIC GENERATING ELEMENT AND METHOD FOR GENERATING ELECTRIC POWER WITH THE PIEZOELECTRIC GENERATING ELEMENT

CROSS-REFERENCE TO RELATED APPLICATIONS

This is a continuation of PCT International Application PCT/JP2010/005744 filed on Sep. 22, 2010, which claims priority of Japanese Patent Application No. 2009-236373, filed on Oct. 13, 2009. The disclosures of these applications including the specifications, the drawings, and the claims are hereby incorporated by reference in their entirety.

BACKGROUND OF THE INVENTION

1. Field of the Invention

The present invention relates to a piezoelectric thin film comprising a piezoelectric layer. The present invention further relates to an ink jet head comprising the piezoelectric thin film, a method for forming an image with the head, an angular velocity sensor comprising the piezoelectric thin film, a method for measuring an angular velocity with the sensor, a piezoelectric generating element comprising the piezoelectric thin film and a method for generating electric power with the element.

2. Description of Related Art

Lead zirconate titanate (PZT: $Pb(Zr_xTi_{1-x})O_3$, $0<x<1$) is a typical ferroelectric material capable of storing a large amount of electric charge. PZT is used in capacitors and thin film memories. PZT has pyroelectricity and piezoelectricity based on the ferroelectricity thereof. PZT has high piezoelectric performance. The mechanical quality factor Qm of PZT can be controlled easily by adjusting the composition or adding an element thereto. These facts allow PZT to be applied to sensors, actuators, ultrasonic motors, filter circuits and oscillators.

PZT, however, contains a large amount of lead. In recent years, there has been a growing concern that lead leaching from waste may cause serious damage to the ecosystem and the environment. Accordingly, there has been an international movement to restrict the use of lead. For this reason, ferroelectric materials containing no lead (lead-free ferroelectric materials) unlike PZT have been in demand.

One example of the lead-free ferroelectric materials that are currently under development is a ceramic of a perovskite composite oxide $[(Bi_{0.5}Na_{0.5})_{1-y}Ba_y]TiO_3$ composed of bismuth (Bi), sodium (Na), barium (Ba) and titanium (Ti). JP 4(1992)-60073 B and T. Takenaka et al., Japanese Journal of Applied Physics, Vol. 30, No. 9B, (1991), pp. 2236-2239, disclose that this ferroelectric material has a piezoelectric constant $d_{33}$ of about 125 pC/N and thus exhibits high piezoelectric performance, when the content of barium y (=[Ba/(Bi+Na+Ba)] is 5% to 10%.

In bulk ferroelectrics such as a ceramic, attempts have been made to improve the piezoelectric performance by adding a slight amount of dopant. D. Q. Xiao et al., Japanese Journal of Applied Physics, Vol. 44, No. 12, (2005), pp. 8515-8518, discloses a (Bi, Na, Ba)$TiO_3$ ceramic to which silver (Ag) is added ((Bi, Na, Ba, Ag)$TiO_3$ ceramic). The piezoelectric constant of this ceramic increases more, as the additional amount of Ag increases. Particularly, the (Bi, Na, Ba, Ag)$TiO_3$ ceramic having a composition with a mole ratio of Ag to Ti of 0.03 has a piezoelectric constant $d_{33}$ that is about 9% higher than the piezoelectric constant $d_{33}$ of the (Bi, Na, Ba, Ag)$TiO_3$ ceramic free from Ag. However, with the addition of Ag, the dielectric loss tan δ of the ceramic increases and the electromechanical coupling coefficient decreases. The electromechanical coupling coefficient represents the conversion efficiency of the electrical energy and mechanical energy.

Other attempts have been made to improve the piezoelectric performance in a piezoelectric thin film by aligning the orientation axis of the crystal in the thin film. One of the methods is to arrange an interface layer (buffer layer) between a substrate and a piezoelectric thin film. JP 10 (1998)-182291 A and JP 2007-266346 A disclose the interface layer containing all or some of the constituent elements of the piezoelectric thin film. Independently of this, H. W. Cheng et al., Applied Physics Letters, Vol. 85, No. 12, (2004), pp. 2319-2321, and Z. H. Zhou et al., Applied Physics Letters, Vol. 85, No. 5, (2004), pp. 804-806, disclose the formation of a piezoelectric thin film oriented in a specific direction by pulsed laser deposition (PLD) or RF magnetron sputtering.

A piezoelectric thin film in which the crystal orientation is not controlled exhibits very low ferroelectric performance and piezoelectric performance. The ferroelectric performance, for example, is the remanent polarization. (Bi, Na, Ba)$TiO_3$ in the form of a ceramic shows a dielectric loss of about 1% (see T. Takenaka et al., Japanese Journal of Applied Physics, Vol. 30, No. 9B, (1991), pp. 2236-2239). In contrast, particularly in a low frequency region of 1 kHz or less, the dielectric loss of the (Bi, Na, Ba)$TiO_3$ thin film suddenly increases and reaches several tens % (see Z. H. Zhou et al., Applied Physics Letters, Vol. 85, No. 5, (2004), pp. 804-806). This is because a leak current is likely to occur in the (Bi, Na, Ba)$TiO_3$ thin film. When the dielectric loss is high, the ferroelectric performance and piezoelectric performance of the thin film is considerably low.

JP 2008-169113 A discloses a piezoelectric magnetic composition that contains Ag as an additional element and is expressed by a specific chemical formula. This composition is a bulk. This composition contains no lead and is excellent in at least one property selected from piezoelectric constant $d_{31}$, relative dielectric constant, dielectric loss and Curie temperature Tc.

SUMMARY OF THE INVENTION

First of all, piezoelectric materials are required to have high piezoelectric performance. Piezoelectric materials are further required to have low dielectric loss and high electromechanical coupling coefficient. Particularly, for use as a sensor, the dielectric loss and electromechanical coupling coefficient are to be emphasized. For this reason, piezoelectric materials are required to have not one but all of (a) a piezoelectric constant $d_{31}$ of −70 pC/N or less (high displacement amount), (b) a dielectric loss tan δ of 5.0% or less (low energy loss) and (c) an electromechanical coupling coefficient $k_{31}$ of 0.30 or more (high energy conversion efficiency).

It is an object of the present invention to provide a lead-free piezoelectric thin film comprising a lead-free ferroelectric material and having low dielectric loss, high electromechanical coupling coefficient and high piezoelectric constant comparable to that of PZT.

It is another object of the present invention to provide an ink jet head, an angular velocity sensor and a piezoelectric generating element each comprising the lead-free piezoelectric thin film. It is still another object of the present invention to provide a method for forming an image with the ink jet head, a method for measuring an angular velocity with the angular velocity sensor and a method for generating electric power with the piezoelectric generating element.

The inventors have found out that: (i) a (Bi, Na, Ba)TiO$_3$ film with excellent (001) orientation is formed by adding a specific amount of Ag to a thin film ((Bi, Na, Ba)TiO$_3$ film) composed of (Bi, Na, Ba)TiO$_3$, which is a lead-free ferroelectric material, without an interface layer between a substrate and a piezoelectric thin film; and (ii) this (Bi, Na, Ba)TiO$_3$ film allows (a) high piezoelectric constant, (b) low dielectric loss, and (c) high electromechanical coupling coefficient to be achieved simultaneously.

The inventors have completed the present invention on the basis of these findings.

The piezoelectric thin film of the present invention has a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01.

The ink jet head of the present invention comprises: a piezoelectric thin film having a piezoelectric layer; a vibration layer bonded to the piezoelectric thin film; and a pressure chamber member having a pressure chamber for storing ink and bonded to the surface of the vibration layer opposite to the surface to which the piezoelectric thin film is bonded. The piezoelectric thin film further has a first electrode and a second electrode that sandwich the piezoelectric layer. The vibration layer is bonded to the piezoelectric thin film so that the vibration layer is displaceable in the film thickness direction of the vibration layer according to a deformation of the piezoelectric thin film produced by the piezoelectric effect. The vibration layer and the pressure chamber member are bonded to each other so that the volumetric capacity of the pressure chamber changes according to a displacement of the vibration layer and so that the ink in the pressure chamber is ejected according to a change in the volumetric capacity of the pressure chamber. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01.

The method of the present invention for forming an image with an ink jet head comprises a step of preparing the ink jet head and the step A to be mentioned later. In this method, the ink jet head comprises: a piezoelectric thin film having a piezoelectric layer; a vibration layer bonded to the piezoelectric thin film; and a pressure chamber member having a pressure chamber for storing ink and bonded to the surface of the vibration layer opposite to the surface to which the piezoelectric thin film is bonded. The piezoelectric thin film further has a first electrode and a second electrode that sandwich the piezoelectric layer. The vibration layer is bonded to the piezoelectric thin film so that the vibration layer is displaceable in the film thickness direction of the vibration layer according to a deformation of the piezoelectric thin film produced by the piezoelectric effect. The vibration layer and the pressure chamber member are bonded to each other so that the volumetric capacity of the pressure chamber changes according to a displacement of the vibration layer and so that the ink in the pressure chamber is ejected according to a change in the volumetric capacity of the pressure chamber. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01. The above-mentioned step A is a step of applying a voltage to the piezoelectric layer through the first electrode and the second electrode to displace the vibration layer in the film thickness direction of the vibration layer produced by the piezoelectric effect so that the volumetric capacity of the pressure chamber changes and so that the ink is ejected from the pressure chamber by the displacement to form an image.

The angular velocity sensor of the present invention comprises: a substrate having a vibration part; and a piezoelectric thin film having a piezoelectric layer. The piezoelectric thin film further has a first electrode and a second electrode that sandwich the piezoelectric layer and is bonded to the vibration part. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01. One electrode selected from the first electrode and the second electrode is composed of an electrode group comprising a drive electrode for applying a driving voltage that oscillates the vibration part to the piezoelectric layer and a sense electrode for measuring a deformation of the vibration part caused by an angular velocity applied to the vibration part that is oscillating.

The method of the present invention for measuring an angular velocity with an angular velocity sensor comprises a step of preparing the angular velocity sensor, the step B and the step C to be mentioned later. In this method, the angular velocity sensor comprises: a substrate having a vibration part; and a piezoelectric thin film having a piezoelectric layer. The piezoelectric thin film further has a first electrode and a second electrode that sandwich the piezoelectric layer and is bonded to the vibration part. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01. One electrode selected from the first electrode and the second electrode is composed of an electrode group comprising a drive electrode and a sense electrode. The above-mentioned step B is a step of applying a driving voltage to the piezoelectric layer through the drive electrode and the other electrode selected from the first electrode and the second electrode to oscillate the vibration part. The above-mentioned step C is a step of measuring, through the other electrode and the sense electrode, a deformation of the vibration part caused by an angular velocity applied to the vibration part that is oscillating to measure a value of the applied angular velocity.

The piezoelectric generating element of the present invention comprises: a substrate having a vibration part; and a piezoelectric thin film having a piezoelectric layer. The piezoelectric thin film further has a first electrode and a second electrode that sandwich the piezoelectric layer and is bonded to the vibration part. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01.

The method of the present invention for generating electric power with a piezoelectric generating element comprises a step of preparing the piezoelectric generating element and the step D to be mentioned later. In this method, the piezoelectric generating element comprises: a substrate having a vibration part; and a piezoelectric thin film having a piezoelectric layer. The piezoelectric thin film further has a first electrode and a second electrode that sandwich the piezoelectric layer and is bonded to the vibration part. The piezoelectric layer is a (Bi, Na, Ba)TiO$_3$ film composed of a perovskite composite oxide (Bi, Na, Ba)TiO$_3$. The (Bi, Na, Ba)TiO$_3$ film has (001) orientation and further contains Ag. The (Bi, Na, Ba)TiO$_3$ film has a mole ratio of Ag to Ti of at least 0.001 but not more than 0.01. The above-mentioned step D is a step of vibrating the vibration part to generate a potential difference between the first electrode and the second electrode.

The present invention provides a lead-free piezoelectric thin film having low dielectric loss (tan δ of 5.0% or less), high electromechanical coefficient ($k_{31}$ of 0.30 or more) and high piezoelectric performance ($d_{31}$ of −70 pC/N or less) comparable to that of PZT, despite being a lead-free material composition.

The present invention provides an ink jet head, an angular velocity sensor and a piezoelectric generating element each comprising the lead-free piezoelectric thin film, and a method for forming an image with the ink jet head, a method for measuring an angular velocity with the angular velocity sensor and a method for generating electric power with the piezoelectric generating element. The ink jet head of the present invention has excellent ink ejection characteristics. The method for forming an image with the ink jet head has high accuracy and high expressiveness. The angular velocity sensor of the present invention has excellent sensitivity. The method for measuring an angular velocity with the angular velocity sensor has excellent angular velocity measurement sensitivity. The piezoelectric generating element of the present invention has excellent electric power generation characteristics. The method for generating electric power with the piezoelectric generating element has excellent electric power generation efficiency.

BRIEF DESCRIPTION OF THE DRAWINGS

FIG. 9D is a cross-sectional view schematically showing an ink jet head obtained by the steps shown in FIG. 5A to FIG. 9C.

DETAILED DESCRIPTION OF THE INVENTION

Figure 1A:
FIG. 1A is a cross-sectional view schematically showing an example of the piezoelectric thin film of the present invention.

Hereinafter, embodiments of the present invention are described. In the following description, the same reference numerals and letters are used to designate the same parts. The overlapping description thereof can be omitted.

<Piezoelectric Thin Film>

FIG. 1A shows one embodiment of the piezoelectric thin film according to the present invention. A piezoelectric thin film 1a shown in FIG. 1A is a (Bi, Na, Ba)$TiO_3$ film 11.

The (Bi, Na, Ba)$TiO_3$ film 11 is a thin film composed of a perovskite composite oxide (Bi, Na, Ba)$TiO_3$. The (Bi, Na, Ba)$TiO_3$ film 11 has (001) plane orientation on its surface. The (Bi, Na, Ba)$TiO_3$ film 11 further contains Ag as an additional element. The content of Ag in the (Bi, Na, Ba)$TiO_3$ film 11 is 0.001 or more and 0.01 or less in terms of the mole ratio of Ag to Ti.

The (Bi, Na, Ba)$TiO_3$ film 11 has high crystallinity and strong (001) orientation. The (Bi, Na, Ba)$TiO_3$ film 11, that is, the piezoelectric thin film 1a has high piezoelectric constant, low dielectric loss and high electromechanical coupling coefficient.

In a thin film composed of (Bi, Na, Ba)$TiO_3$, an additional element suitable for improving these three properties cannot be expected at all from the ionic radius or the similarity in chemical properties. The reason for this is that, in a thin film composed of a multi-component composite oxide, such as (Bi, Na, Ba)$TiO_3$, each element (except for oxygen) composing the thin film has a different vapor pressure, and these differences in the vapor pressure affect a deposition of each element and make it difficult to form a thin film with good crystallinity and good orientation. The inventors have found that a (Bi, Na, Ba)$TiO_3$ thin film containing at least 0.001 but not more than 0.01 of Ag in terms of the mole ratio of Ag to Ti has high crystallinity and strong (001) orientation, and it also has high piezoelectric constant, low dielectric loss and high electromechanical coupling coefficient.

(Bi, Na, Ba)$TiO_3$ has a perovskite crystal structure represented by a chemical formula $ABO_3$. The A-site and the B-site have an average valence of 2 and 4, respectively, depending on the arrangement of a single element or a plurality of elements. The A-site is Bi, Na and Ba. The B-site is Ti.

The (Bi, Na, Ba)$TiO_3$ film 11 may contain a slight amount of impurities. The impurities typically can be Li and K to substitute for Na, and Sr and Ca to substitute for Ba, in the A-site. The impurities typically can be Zr to substitute for Ti in the B-site. Other examples of the impurities can be Mn, Fe, Nb and Ta. Some of these impurities can improve the crystallinity and piezoelectric performance of the (Bi, Na, Ba)$TiO_3$ film 11.

The thickness of the (Bi, Na, Ba)$TiO_3$ film 11 is not limited. The thickness thereof, for example, is at least 0.5 μm but not more than 10 μm. Even if the (Bi, Na, Ba)$TiO_3$ film 11 is thin, this film has high piezoelectric constant, low dielectric loss and high electromechanical coupling coefficient.

The (Bi, Na, Ba)$TiO_3$ film 11 can be formed typically by sputtering. The (Bi, Na, Ba)$TiO_3$ film 11 can be formed also by other thin film formation techniques, such as PLD, chemical vapor deposition (CVD), sol-gel processing and aerosol deposition (AD).

Figure 1B:
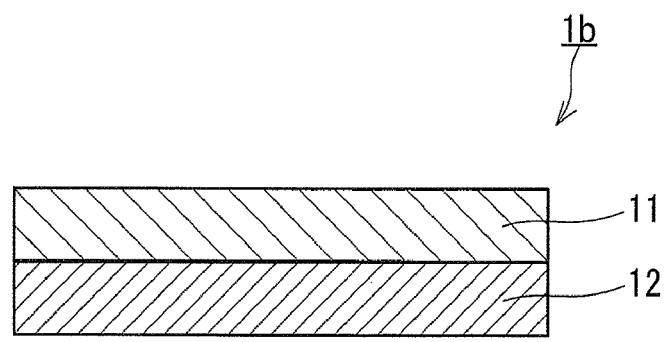
FIG. 1B is a cross-sectional view schematically showing another example of the piezoelectric thin film of the present invention.

FIG. 1B shows another embodiment of the piezoelectric thin film according to the present invention. A piezoelectric thin film 1b shown in FIG. 1B further comprises a $LaNiO_3$ film 12 in addition to the (Bi, Na, Ba)$TiO_3$ film 11. The (Bi, Na, Ba)$TiO_3$ film 11 is formed on the $LaNiO_3$ film 12. The (Bi, Na, Ba)$TiO_3$ film 11 and the $LaNiO_3$ film 12 are in contact with each other. The (Bi, Na, Ba)$TiO_3$ film 11 is a piezoelectric layer. The above-mentioned properties of the (Bi, Na, Ba)$TiO_3$ film 11 allow the piezoelectric thin film 1b to have high piezoelectric constant, low dielectric loss and high electromechanical coupling coefficient.

The $LaNiO_3$ film 12 has (001) plane orientation on its surface. The $LaNiO_3$ film 12 has a perovskite crystal structure represented by a chemical formula $ABO_3$. This crystal structure has a lattice constant of 0.384 nm (pseudocubic crystal). For this reason, the $LaNiO_3$ film 12 has good lattice matching with the (Bi, Na, Ba)$TiO_3$ film 11. The $LaNiO_3$ film 12 has (001) orientation regardless of the composition and crystal structure of the base layer of the film. For example, the $LaNiO_3$ film 12 having (001) orientation can be formed on a monocrystalline Si substrate having a lattice constant (0.543 nm), which is significantly different from that of the $LaNiO_3$ film 12. The $LaNiO_3$ film 12 having (001) orientation can be formed also on a substrate made of metal such as stainless steel, a substrate made of an amorphous material such as glass, or a ceramic substrate.

The $LaNiO_3$ film 12 may contain a slight amount of impurities. The impurities typically are a rare earth element to substitute for La.

$LaNiO_3$ is an oxide conductor. The $LaNiO_3$ film 12 can function as an electrode layer (first electrode) for applying a voltage to the (Bi, Na, Ba)$TiO_3$ film 11.

The $LaNiO_3$ film 12 typically can be formed by sputtering. The $LaNiO_3$ film 12 can be formed also by other thin film formation techniques, such as PLD, CVD, sol-gel processing and AD.

The first electrode comprises the $LaNiO_3$ film 12. The first electrode may comprise another conductive film above or below the $LaNiO_3$ film, or both above and below it. This conductive film, for example, is a thin film made of metal such as platinum (Pt), palladium (Pd) and gold (Au), or a thin film made of conductive oxide such as nickel oxide (NiO), ruthenium oxide ($RuO_2$), iridium oxide ($IrO_2$) and strontium ruthenate ($SrRuO_3$). These thin films have heat resistance and low electrical resistance.

Figure 1C:
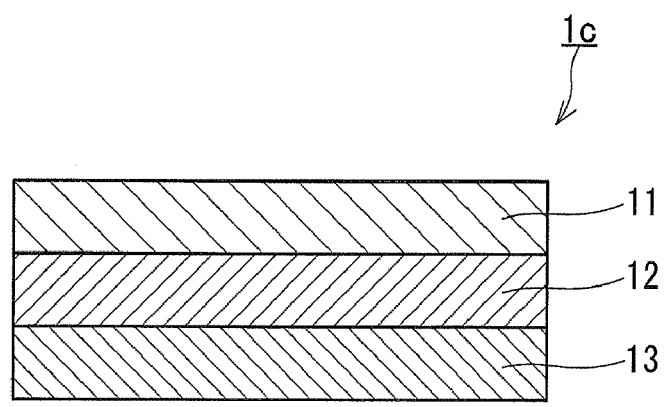
FIG. 1C is a cross-sectional view schematically showing still another example of the piezoelectric thin film of the present invention.

FIG. 1C shows still another embodiment of the piezoelectric thin film according to the present invention. A piezoelectric thin film 1c shown in FIG. 1C further comprises a substrate 13 in addition to the piezoelectric thin film 1b shown in FIG. 1B. The $LaNiO_3$ film 12 is sandwiched between the (Bi, Na, Ba)$TiO_3$ film 11 and the substrate 13. The (Bi, Na, Ba)$TiO_3$ film 11 is in contact with the $LaNiO_3$ film 12, and the $LaNiO_3$ film 12 is in contact with the substrate 13. The above-mentioned properties of the (Bi, Na, Ba)$TiO_3$ film 11 allow the piezoelectric thin film 1c to have high piezoelectric constant, low dielectric loss and high electromechanical coupling coefficient.

The substrate 13 can be a silicon (Si) substrate. The substrate 13 is preferably a monocrystalline Si substrate.

Between the first electrode (the $LaNiO_3$ film 12 in the example shown in FIG. 1C) and the substrate 13, an adhesive layer for improving the adhesion between the two can be arranged. However, the adhesive layer is required to have electrical conductivity. Examples of the material for the adhesive layer include Ti. The material can be Ta, Fe, Co, Ni, Cr, or a compound of these. The adhesive layer can be composed of two or more of these materials. The adhesive layer can be omitted depending on the adhesion between the first electrode and the substrate 13.

The piezoelectric thin film 1c shown in FIG. 1C can be manufactured through sequentially forming the $LaNiO_3$ film 12 and the (Bi, Na, Ba)$TiO_3$ film 11 on the substrate 13. Each film typically can be formed by sputtering.

Figure 1D:
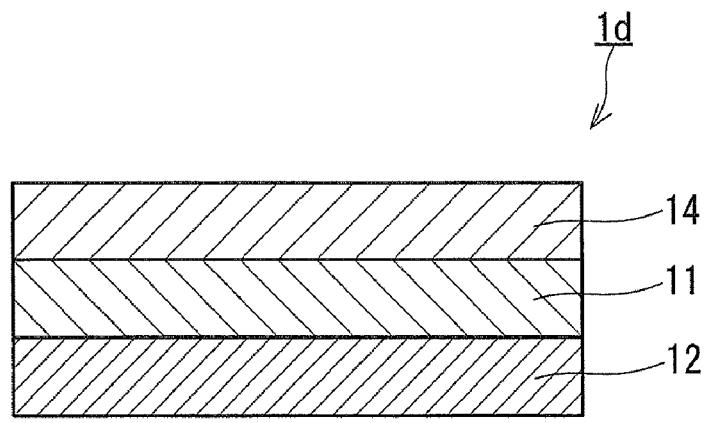
FIG. 1D is a cross-sectional view schematically showing further another example of the piezoelectric thin film of the present invention.

FIG. 1D shows further another embodiment of the piezoelectric thin film according to the present invention. A piezoelectric thin film 1d shown in FIG. 1D further comprises a conductive film 14 in addition to the piezoelectric thin film 1b shown in FIG. 1B. The (Bi, Na, Ba)$TiO_3$ film 11 is sandwiched between the conductive film 14 and the $LaNiO_3$ film 12. The conductive film 14 is in contact with the (Bi, Na, Ba)$TiO_3$ film 11, and the (Bi, Na, Ba)$TiO_3$ film 11 is in contact with the $LaNiO_3$ film 12. The above-mentioned properties of the (Bi, Na, Ba)$TiO_3$ film 11 allow the piezoelectric thin film 1d to have high piezoelectric constant, low dielectric loss and high electromechanical coupling coefficient.

The conductive film 14 can function as an electrode layer (second electrode) for applying a voltage to the (Bi, Na, Ba)$TiO_3$ film 11 that is a piezoelectric layer, together with the $LaNiO_3$ film 12.

The conductive film 14 is composed of a material having conductivity. This material, for example, is a metal, such as Pt, Pd and Au, and an oxide conductor, such as NiO, $RuO_2$, $IrO_2$ and $SrRuO_3$. These thin films have heat resistance and low electrical resistance. Between the conductive film 14 and the (Bi, Na, Ba)$TiO_3$ film 11, an adhesive layer for improving the adhesion between the two can be arranged. Examples of the material for the adhesive layer include Ti. The material can be Ta, Fe, Co, Ni, Cr, or a compound of these. The adhesive layer can be composed of two or more of these materials. The adhesive layer can be omitted depending on the adhesion between the conductive film 14 and the (Bi, Na, Ba)$TiO_3$ film 11.

The piezoelectric thin film 1d shown in FIG. 1D can be manufactured through sequentially forming the $LaNiO_3$ film 12, the (Bi, Na, Ba)$TiO_3$ film 11 and the conductive film 14. Each film typically can be formed by sputtering.

Figure 1E:
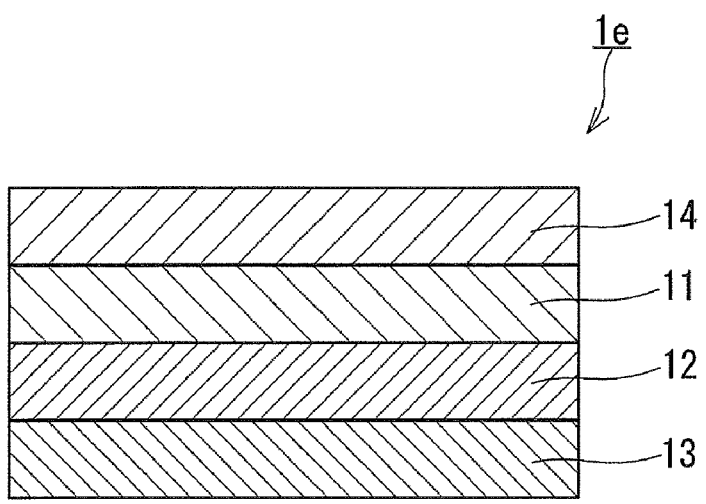
FIG. 1E is a cross-sectional view schematically showing further another example of the piezoelectric thin film of the present invention.

FIG. 1E shows further another embodiment of the piezoelectric thin film according to the present invention. A piezoelectric thin film 1e shown in FIG. 1E further comprises the substrate 13 in addition to the piezoelectric thin film 1d shown in FIG. 1D. Viewed from another aspect, the piezoelectric thin film 1e shown in FIG. 1E further comprises the conductive film 14 in addition to the piezoelectric thin film 1c shown in FIG. 1C. The piezoelectric thin film 1e has a multilayer structure in which the substrate 13, the $LaNiO_3$ film 12, the (Bi, Na, Ba)$TiO_3$ film 11 and the conductive film 14 are laminated in this order. The $LaNiO_3$ film 12 and the conductive film 14 can function as the first electrode and the second electrode for applying a voltage to the (Bi, Na, Ba)$TiO_3$ film 11. The above-mentioned properties of the (Bi, Na, Ba)$TiO_3$ film 11 allow the piezoelectric thin film 1e to have high piezoelectric constant, low dielectric loss and high electromechanical coupling coefficient.

The piezoelectric thin film 1e shown in FIG. 1E can be manufactured by sequentially forming the $LaNiO_3$ film 12, the (Bi, Na, Ba)$TiO_3$ film 11 and the conductive layer 14 on the substrate 13. Each film typically can be formed by sputtering.

The piezoelectric thin films 1a to 1e shown in FIG. 1A to FIG. 1E each can be manufactured using a base substrate.

The base substrate can be one of the following substrates: a substrate made of an oxide having a NaCl structure such as magnesium oxide (MgO); a substrate made of an oxide having a perovskite structure such as $SrTiO_3$, $LaAlO_3$ and $NdGaO_3$; a substrate made of an oxide having a corundum structure such as $Al_2O_3$; a substrate made of an oxide having a spinel structure such as $MgAl_2O_4$; a substrate made of an oxide having a rutile structure such as $TiO_2$; and a substrate made of an oxide having a cubic crystal structure such as (La,Sr)(Al,Ta)$O_3$ and yttria-stabilized zirconia (YSZ). The base substrate can be formed by laminating an oxide thin film having a NaCl crystal structure on the surface of: a glass substrate; a ceramic substrate such as an alumina substrate; or a metal substrate such as a stainless steel substrate. Examples of the oxide thin film include a MgO thin film, a nickel oxide (NiO) thin film and a cobalt oxide (CoO) thin film.

The piezoelectric thin film of the present invention may comprise an arbitrary layer between the respective films composing the thin film, as long as the effects of the present invention can be obtained.

<Ink Jet Head>

The ink jet head of the present invention is described with reference to FIG. 2 to FIG. 12B.

Figure 2:
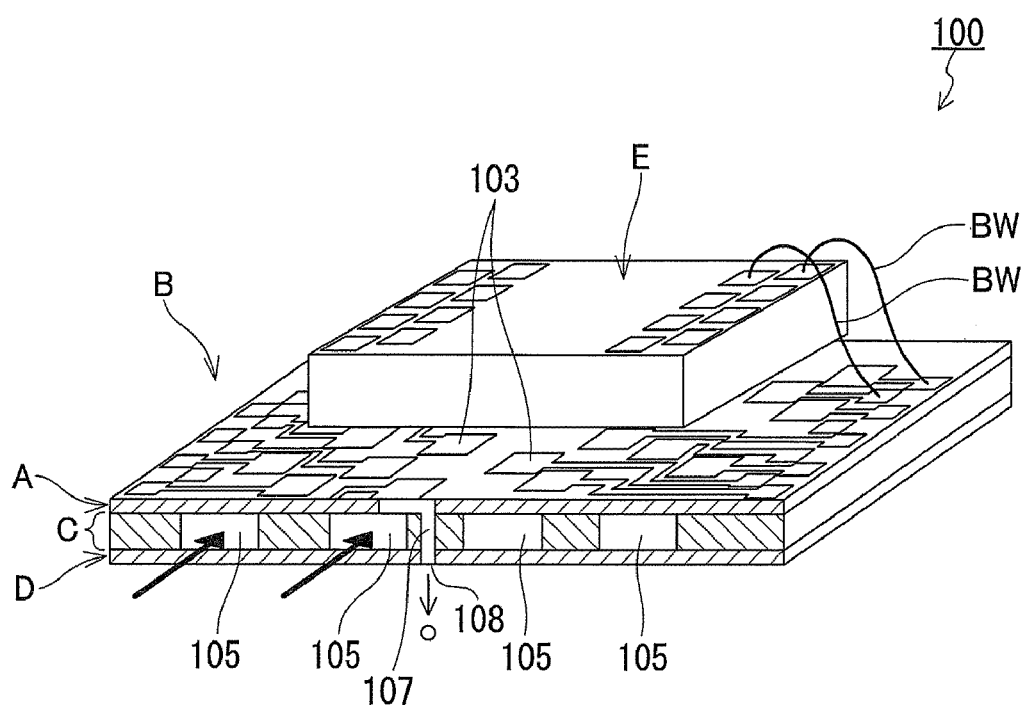
FIG. 2 is a perspective view schematically showing an example of the ink jet head of the present invention and partially showing a cross section of the ink jet head.
Figure 3:
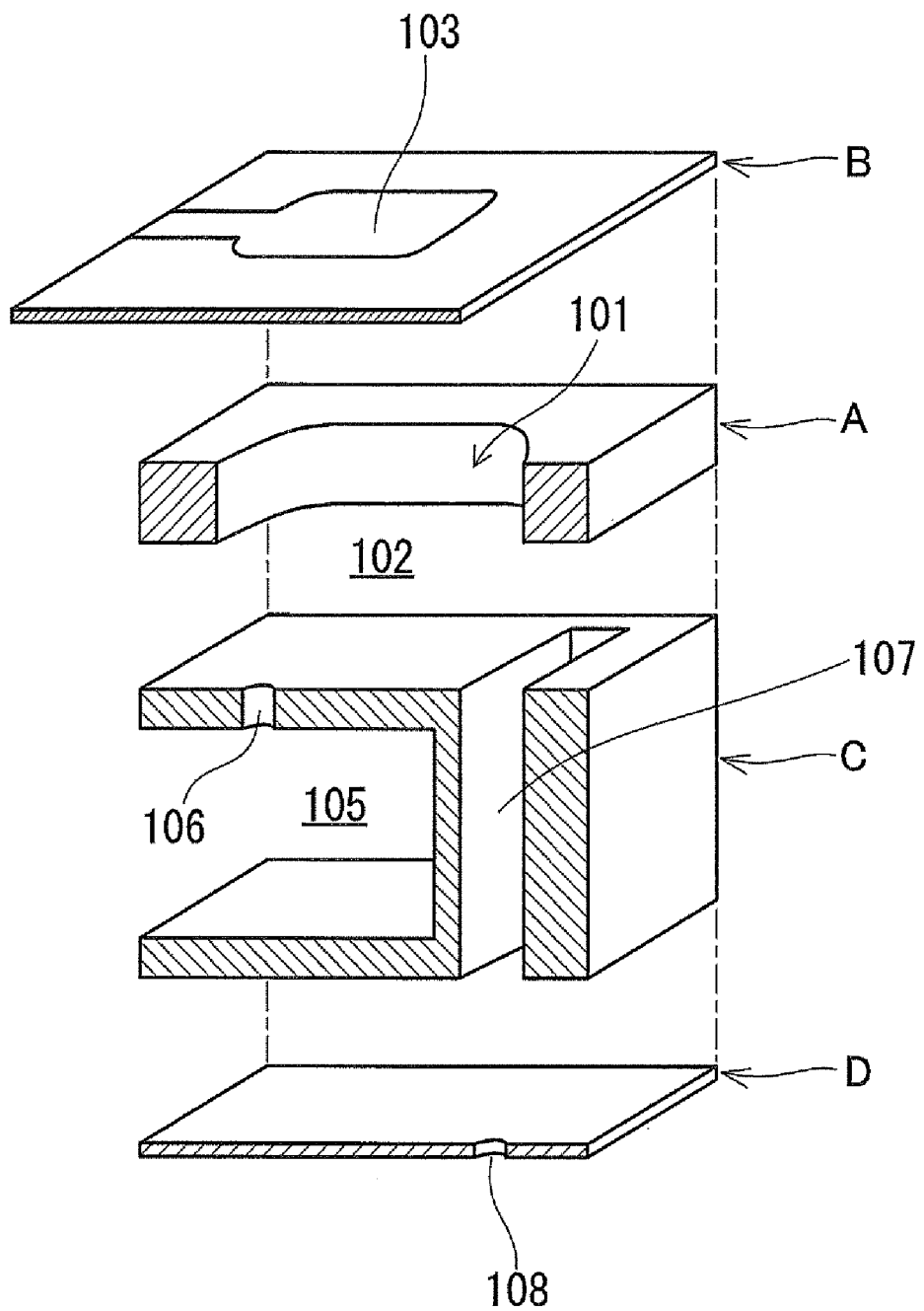
FIG. 3 is an exploded perspective view schematically showing the main parts of the ink jet head shown in FIG. 2 including a pressure chamber member and an actuator part, and partially showing a cross section of the main parts.

FIG. 2 shows one embodiment of the ink jet head of the present invention. FIG. 3 is an exploded view showing the main parts of an ink jet head 100 shown in FIG. 2. The main parts include a pressure chamber member and an actuator part.

The reference character A in FIG. 2 and FIG. 3 indicates a pressure chamber member. The pressure chamber member A comprises a through-hole 101 that passes therethrough in its thickness direction (in the upward and downward directions in these views). A part of the through-hole is shown in FIG. 3 as the through-hole 101, which is a cross section of the through-hole cut in the thickness direction of the pressure chamber member A. The reference character B indicates an actuator part comprising a piezoelectric thin film and a vibration layer. The reference character C indicates an ink passage member C comprising a common liquid chamber 105 and an ink passage 107. The pressure chamber member A, the actuator part B and the ink passage member C are bonded to each other so that the pressure chamber member A is sandwiched between the actuator part B and the ink passage member C. The through-hole 101 forms a pressure chamber 102 for storing ink supplied from the common liquid chamber 105, in the state where the pressure chamber member A, the actuator part B and the ink passage member C are bonded to each other.

The piezoelectric thin film and the vibration layer comprised in the actuator part B are aligned over the pressure chamber 102 in plan view. In FIG. 2 and FIG. 3, the reference numeral 103 indicates an individual electrode layer that is a part of the piezoelectric thin film. As shown in FIG. 2, the ink jet head 100 comprises at least two individual electrode layers 103, that is, piezoelectric thin films, arranged in a zigzag pattern in plan view.

The ink passage member C comprises at least two common liquid chambers 105 arranged in a stripe pattern in plan view. Each common liquid chamber 105 is aligned over at least two pressure chambers 102 in plan view. The common liquid chamber 105 extends in the ink supply direction (in the direction indicated by arrows in FIG. 2) in the ink jet head 100. The ink passage member C comprises supply ports 106 for supplying the ink in the common liquid chambers 105 to the pressure chambers 102, and ink passages 107 for allowing the ink in the pressure chambers 102 to be ejected through the nozzle holes 108. Normally, one supply port 106 and one nozzle hole 108 correspond to one pressure chamber 102. The nozzle holes 108 are formed in a nozzle plate D. The nozzle plate D is bonded to the ink passage member C so that the nozzle plate D and the pressure chamber member A sandwich the ink passage member C therebetween.

In FIG. 2, the reference character E indicates an IC chip. The IC chip E is connected electrically to the individual electrode layers 103, which are exposed on the surface of the actuator part B, through bonding wires BW. For simplicity of FIG. 2, only a few of the bonding wires BW are shown in FIG. 2.

Figure 4:
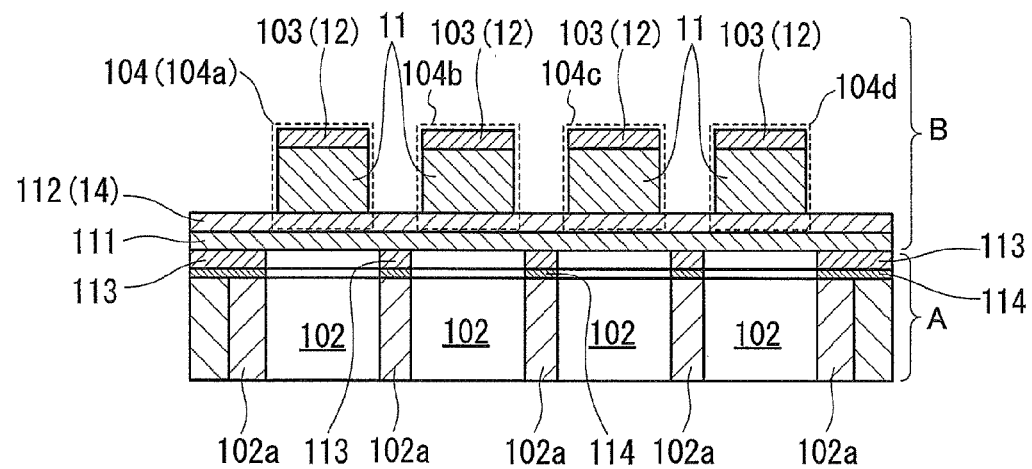
FIG. 4 is a cross-sectional view schematically showing an example of the main parts of the ink jet head shown in FIG. 2 that comprise the pressure chamber member and the actuator part.

FIG. 4 shows the configuration of the main parts comprising the pressure chamber member A and the actuator part B. FIG. 4 shows a cross section perpendicular to the ink supply direction (the direction indicated by the arrows in FIG. 2) in the pressure chamber member A and the actuator part B. The actuator part B comprises piezoelectric thin films 104 (104a to 104d) each having the piezoelectric layer 11 sandwiched between a first electrode (individual electrode layer 103) and a second electrode (common electrode layer 112). The individual electrode layers 103 correspond one-to-one to the piezoelectric thin films 104a to 104d. The common electrode layer 112 is an electrode that is common to the piezoelectric thin films 104a to 104d.

The piezoelectric thin films 104 shown in FIG. 4 each correspond to the piezoelectric thin film 1d shown in FIG. 1D. The individual electrode layers 103 each correspond to the LaNiO$_3$ film 12 or a laminate of the LaNiO$_3$ film 12 and another conductive film. The common electrode layer 112 corresponds to the conductive film 14. However, the individual electrode layers 103 of the ink jet head of the present invention are not limited to an electrode layer comprising the LaNiO$_3$ film 12. The individual electrode layers 103 can be composed of a material having electrical conductivity.

In the piezoelectric thin films 104 shown in FIG. 4, the LaNiO$_3$ film 12, the (Bi, Na, Ba)TiO$_3$ film 11 and the conductive film 14 are basically as described above for the piezoelectric thin film of the present invention, including the preferred embodiments thereof.

The conductive film 14 that is the common electrode layer 112 can be a Pt film having an adhesive layer made of a conductive material on its surface. Preferably, the conductive material is Ti. This is because Ti has high adhesion to the (Bi, Na, Ba)TiO$_3$ film 11 and can function well as an adhesive layer between the piezoelectric layer and the common electrode layer.

Either of the first electrode and the second electrode can serve as an individual electrode layer as long as the voltage applied between the first electrode and the second electrode can induce a deformation of the piezoelectric layer 11. In this case, the common electrode layer 112 that is the first electrode is composed of the LaNiO$_3$ film 12. Alternatively, the common electrode layer 112 is composed of a laminate of the LaNiO$_3$ film 12 and another conductive film. The individual electrode layer 103 is composed of the conductive film 14. However, the common electrode layer 112 of the ink jet head of the present invention is not limited to an electrode layer comprising the LaNiO$_3$ film 12. The common electrode layer 112 can be composed of a material having electrical conductivity.

The individual electrode layer 103 preferably has a thickness of at least 0.05 μm but not more than 1 μm. The (Bi, Na, Ba)TiO$_3$ film 11 preferably has a thickness of at least 0.5 μm but not more than 5 μm. The common electrode layer 112 preferably has a thickness of at least 0.05 μm but not more than 0.5 μm.

The actuator part B further comprises a vibration layer 111. The vibration layer 111 is bonded to the common electrode layer 112 of the piezoelectric thin films 104. The vibration layer 111 is displaced in the film thickness direction of the vibration layer 111 according to a deformation of each piezoelectric thin film 104 due to the piezoelectric effect. Application of a voltage to the piezoelectric layer 11 through the individual electrode layer 103 and the common electrode layer 112 causes a deformation of the piezoelectric thin film 104 due to the piezoelectric effect.

The pressure chamber member A is bonded to the vibration layer 111 via intermediate layers 113 and adhesive layers 114. The pressure chamber member A and the piezoelectric thin films 104 sandwich the vibration layer 111 therebetween.

The configuration of the vibration layer 111, the bonding state of the vibration layer 111 to the piezoelectric thin films 104, and the bonding state of the vibration layer 111 to the pressure chamber member A are not limited as long as: (1) the vibration layer 111 is displaceable according to a deformation of each piezoelectric thin film 104 due to the piezoelectric effect; (2) the volumetric capacity of the pressure chamber 102 changes according to a displacement of the vibration layer 111; and (3) the ink in the pressure chamber 102 can be ejected according to a change in the volumetric capacity of the pressure chamber 102. In FIG. 4, the vibration layer 111 forms a wall of the pressure chamber 102.

The material composing the vibration layer 111, for example, is Cr. The material can be Ni, aluminum (Al), Ta, tungsten (W), silicon, or an oxide or nitride of these elements (for example, silicon dioxide, aluminum oxide, zirconium oxide or silicon nitride). Preferably, the vibration layer 111 has a thickness of at least 2 μm but not more than 5 μm.

The material composing the adhesive layer 114, for example, is an adhesive or a glue. A person skilled in the art can appropriately select the type of adhesive or glue.

The intermediate layers (longitudinal walls) 113 prevent the adhesive layer 114 from adhering to a portion of the vibration layer 111 exposed to the pressure chamber 102 when the pressure chamber member A is bonded to the vibration layer 111 via the adhesive layers 114. The adhesive that has adhered to the portion prevents the displacement of the vibration layer 111. The material composing the intermediate layers 113 is not limited as long as the functions of the ink jet head 100 are maintained. The material of the intermediate layers 113, for example, is Ti. The intermediate layers 113 can be omitted.

The pressure chamber member A has partition walls 102a between adjacent pressure chambers 102.

An example of the method for manufacturing the ink jet head 100 shown in FIG. 2 is described with reference to FIG. 5A to FIG. 10.

Figure 5A:
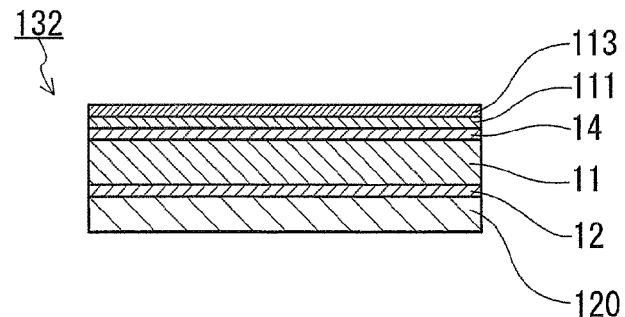
FIG. 5A is a cross-sectional view schematically showing a step of forming a laminate comprising a piezoelectric layer in an example of a method for manufacturing the ink jet head shown in FIG. 2.

First, as shown in FIG. 5A, the LaNiO$_3$ film 12, the (Bi, Na, Ba)TiO$_3$ film (piezoelectric layer) 11, the conductive film 14, the vibration layer 111 and the intermediate layer 113 are formed on a base substrate 120 in this order, so that a laminate 132 is obtained. The thin film formation technique for forming each layer (film) is not specifically limited. Examples of the technique include PLD, CVD, sol-gel processing, AD and sputtering. Sputtering is preferably used as the technique.

Figure 5B:
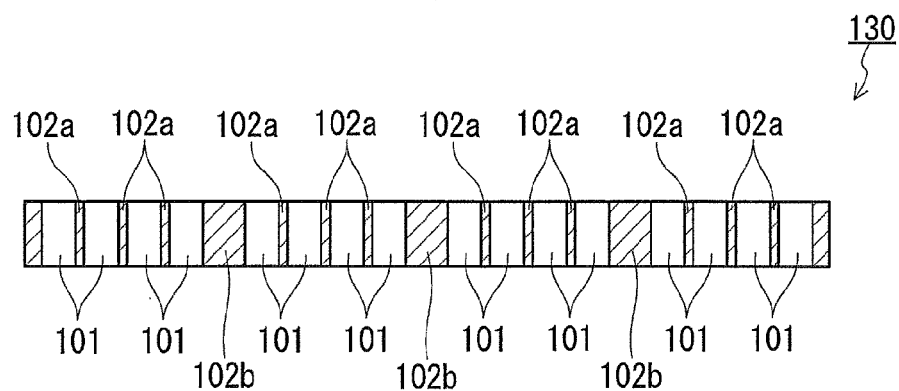
FIG. 5B is a cross-sectional view schematically showing a step of forming a member to serve later as the pressure chamber member in the example of the method for manufacturing the ink jet head shown in FIG. 2.
Figure 10:
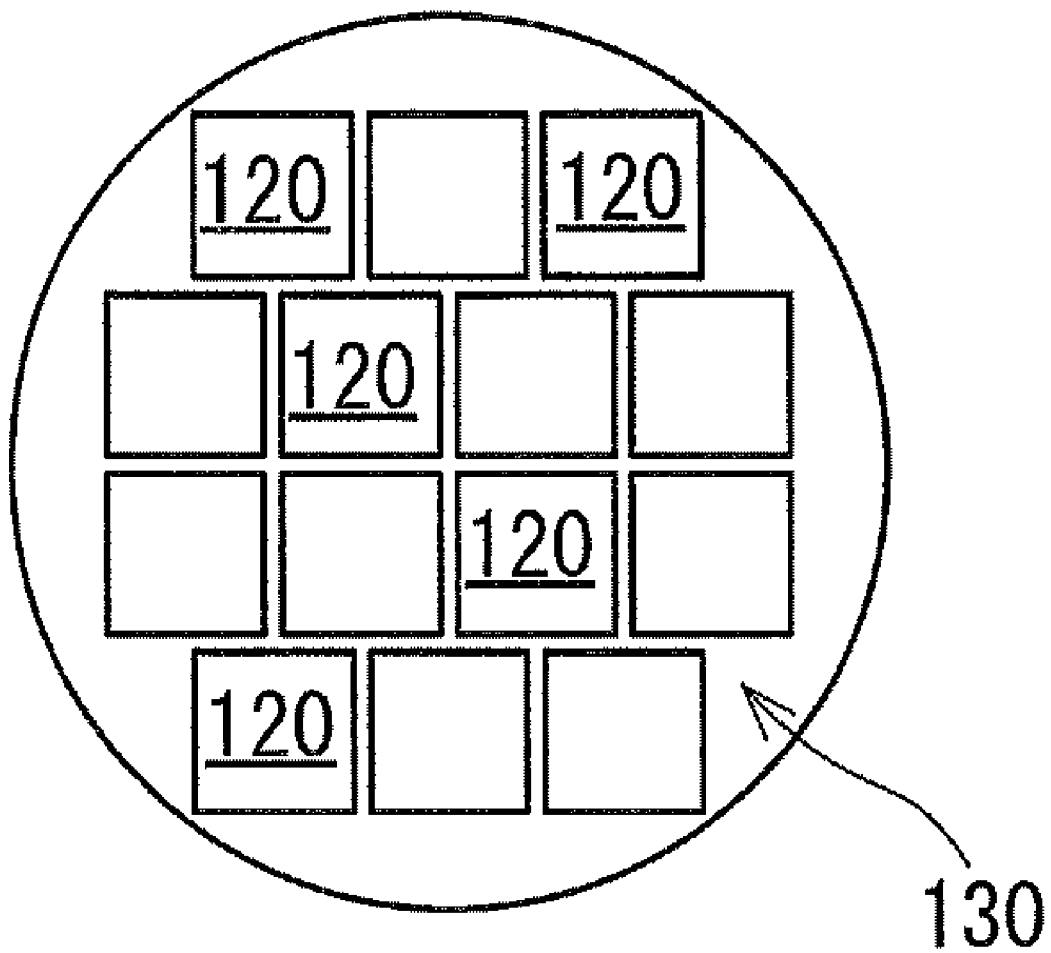
FIG. 10 is a plan view schematically showing an example in which a laminate to serve later as an actuator part is arranged on a substrate to serve later as a pressure chamber member.

Apart from the formation of the laminate 132, a member to serve later as the pressure chamber member A is formed. This member can be formed, for example, by microfabricating a Si substrate (preferably, a monocrystalline Si substrate). It is preferable that the Si substrate be larger in size than the base substrate 120. (See FIG. 10. In FIG. 10, the reference numeral 130 indicates a Si substrate. The substrate indicated by the reference numeral 130 can be a substrate other than the Si substrate.) More specifically, as shown in FIG. 5B, a plurality of through-holes 101 are formed in the substrate 130. The through-holes 101 function as the pressure chambers 102 after this member is bonded to the separately formed actuator part and ink passage member. In FIG. 5B, one through-hole group consists of four through-holes 101. The substrate 130 comprises a plurality of the through-hole groups. The first partition wall 102a is a partition between adjacent two through-holes 101 belonging to one through-hole group. The second partition wall 102b is a partition between adjacent two through-hole groups. Preferably, the second partition wall 102b is at least twice as thick as the first partition wall 102a. The through-hole 101 can be provided in the substrate 130 by a well-known microfabrication technique. The technique, for example, can be a combination of patterning and etching. The etching can be chemical etching or dry etching. The shape of the through-hole 101 can conform to the desired shape of the pressure chamber 102. Hereinafter, the first partition walls 102a and the second partition walls 102b are referred to collectively as partition walls 102.

Figure 5C:
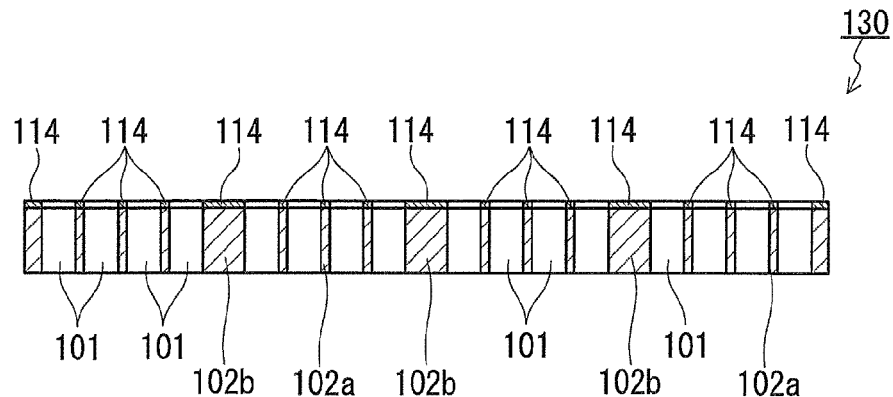
FIG. 5C is a cross-sectional view schematically showing a step of forming an adhesive layer in the example of the method for manufacturing the ink jet head shown in FIG. 2.

Next, as shown in FIG. 5C, the adhesive layers 114 are formed respectively on the partition walls 102. The method for forming the adhesive layers 114 is not limited. An example of the method can be electrodeposition.

Figure 6A:
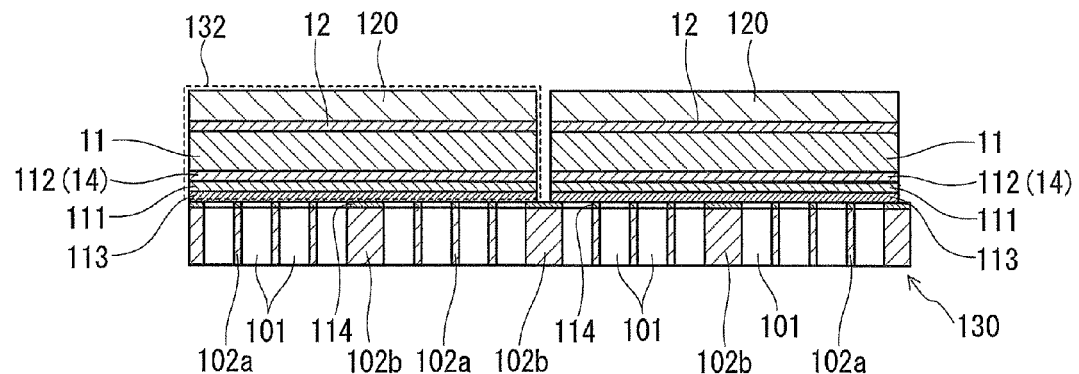
FIG. 6A is a cross-sectional view schematically showing a step of bonding the laminate formed in the step shown in FIG. 5A and the member formed in the step shown in FIG. 5B, in the example of the method for manufacturing the ink jet head shown in FIG. 2.

Then, as shown in FIG. 6A, the substrate 130 is bonded to the laminates 132. This bonding allows the intermediate layer 113 to be sandwiched between the substrate 130 and each laminate 132. As shown in FIG. 10, when the substrate 130 is larger in size than the base substrate 120, a plurality of the laminates 132 (14 laminates in the example shown in FIG. 10. In FIG. 10, the base substrates 120 comprised in the laminates 132 are brought into view) can be bonded to the substrate 130. In FIG. 6A, two laminates 132 are bonded to the substrate 130. In FIG. 6A, the center of each of the two laminates 132 is positioned on the extension of the second partition wall 102b. Bonding the substrate 130 to the laminates 132 allows the conductive film 14 to serve as the common electrode layer 112.

When the adhesive layers 114 are composed of a thermosetting adhesive, it is preferable that the adhesive layers 114 be cured completely by the application of heat, after the substrate 130 is bonded to the laminates 132. A portion of the adhesive layers 114 spread into the through-holes 101 during the bonding can be removed by plasma treatment.

Figure 6B:
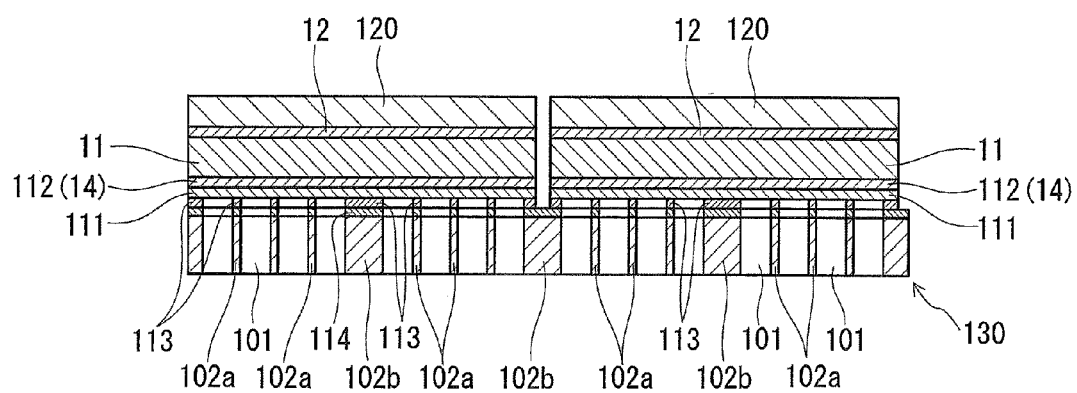
FIG. 6B is a cross-sectional view schematically showing a step (step of etching an intermediate layer) following the step shown in FIG. 6A in the example of the method for manufacturing the ink jet head shown in FIG. 2.

Next, as shown in FIG. 6B, the intermediate layer 113 is etched using the partition walls 102 as a mask. The etching of the intermediate layer 113 is performed in accordance with the cross-sectional shape of the through-holes 101. The vibration layer 111 is thus exposed to the through-holes 101. This etching transforms the shape of the intermediate layer 113 into the same shape as the partition walls 102 in plan view. Each intermediate layer 113 composes a longitudinal wall together with the partition wall 102 and the adhesion layer 114. In this manner, the pressure chamber member A comprising the substrate 130, the intermediate layers 113 and the adhesive layers 114 is formed.

In the example shown in FIG. 5B to FIG. 6B, the substrate 130 in which the through-holes 101 are formed is bonded to the laminates 132 comprising the piezoelectric layer 11. The pressure chamber member A also can be formed, instead of the above procedure, by bonding the substrate 130 comprising no through-hole 101 to the laminates 132 and then forming the through-holes 101 in the substrate 130 to expose the vibration layer 111 to the through-holes 101.

Figure 7A:
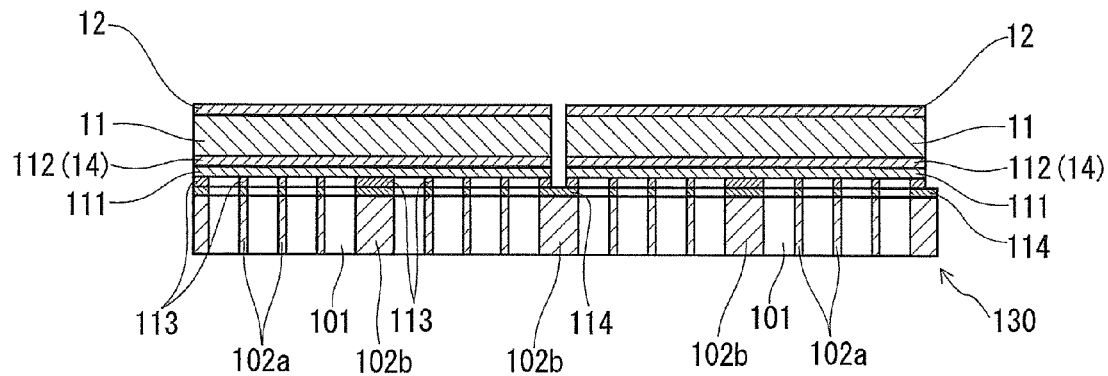
FIG. 7A is a cross-sectional view schematically showing a step (step of removing a base substrate) following the step shown in FIG. 6B in the example of the method for manufacturing the ink jet head shown in FIG. 2.

Then, as shown in FIG. 7A, the base substrates 120 are removed, for example, by etching.

Figure 7B:
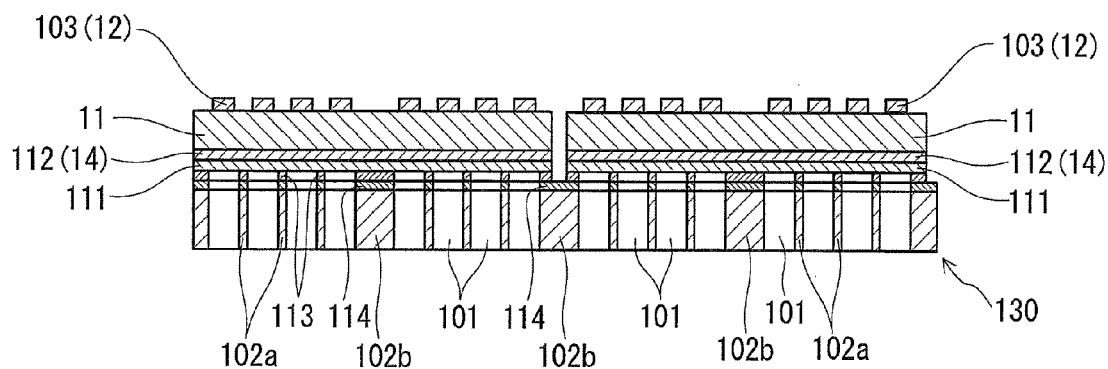
FIG. 7B is a cross-sectional view schematically showing a step (step of forming an individual electrode layer) following the step shown in FIG. 7A in the example of the method for manufacturing the ink jet head shown in FIG. 2.

Next, as shown in FIG. 7B, the LaNiO$_3$ film 12 is transformed into at least two individual electrode layers 103 using a microfabrication technique combining photolithography and etching. The individual electrode layers 103 correspond one-to-one to the through-holes 101 in plan view.

Figure 8A:
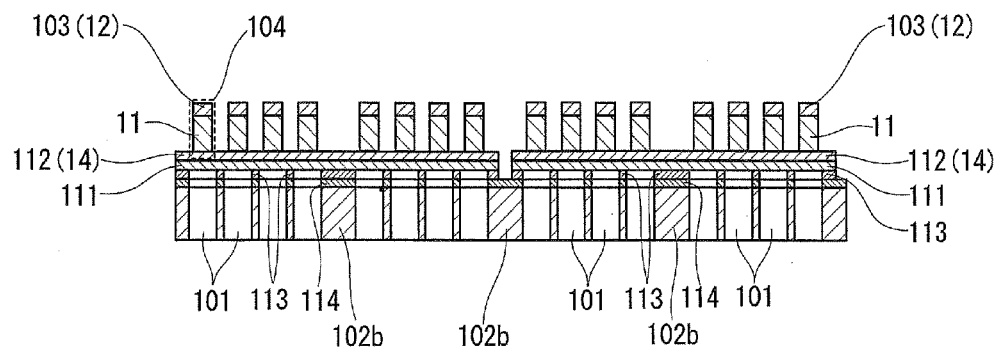
FIG. 8A is a cross-sectional view schematically showing a step (step of microfabricating the piezoelectric layer) following the step shown in FIG. 7B in the example of the method for manufacturing the ink jet head shown in FIG. 2.

Thereafter, as shown in FIG. 8A, the (Bi, Na, Ba)TiO$_3$ film 11 is microfabricated. All the microfabricated (Bi, Na, Ba)TiO$_3$ films 11 have the same shape as the individual electrode layers 103 in plan view. It is preferable that, in this microfabrication, the center of each layer (film) coincides with the center of the corresponding through-hole 101 with high accuracy in plan view. In this manner, the actuator part B comprising the piezoelectric thin films 104, each composed of the individual electrode layer 103 (the LaNiO$_3$ film 12), the (Bi, Na, Ba)TiO$_3$ film 11 and the common electrode layer 112 (the conductive film 14), and the vibration layer 111 is formed.

Figure 8B:
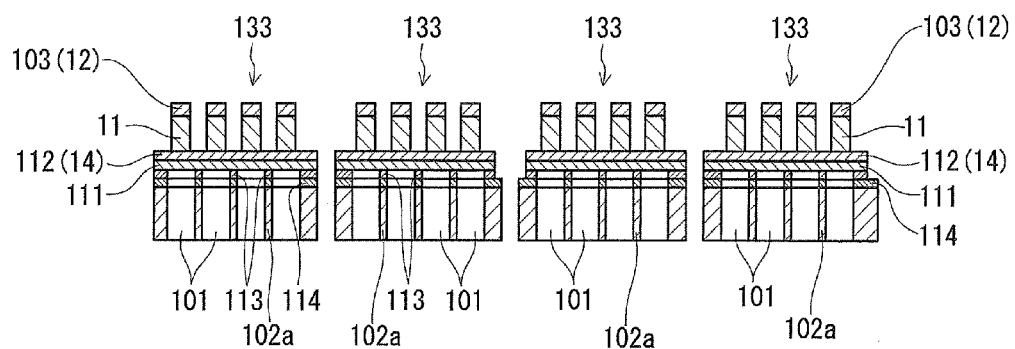
FIG. 8B is a cross-sectional view schematically showing a step (step of cutting the substrate) following the step shown in FIG. 8A in the example of the method for manufacturing the ink jet head shown in FIG. 2.

Next, as shown in FIG. 8B, the common electrode layer 112, the vibration layer 111 and the substrate 130 are cut along each second partition wall 102b to obtain at least two members 133. Each member 133 comprises the actuator part B, and the pressure chamber member A having at least two through-holes 101. The actuator part B is bonded to the pressure chamber member A.

Figure 9A:
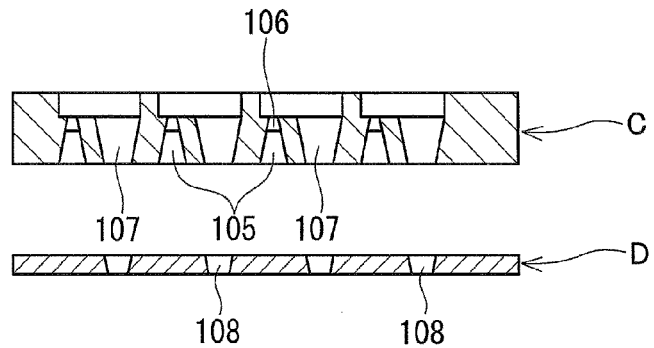
FIG. 9A is a cross-sectional view schematically showing a step of preparing an ink passage member and a nozzle plate in the example of the method for manufacturing the ink jet head shown in FIG. 2.

Apart from the above-mentioned procedures, as shown in FIG. 9A, the ink passage member C comprising the common liquid chambers 105, the supply ports 106 and the ink passages 107, and the nozzle plate D comprising the nozzle holes 108 are prepared.

Figure 9B:
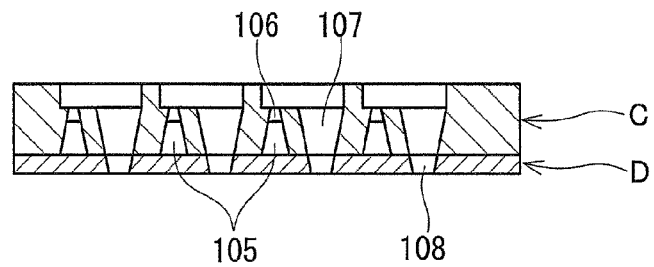
FIG. 9B is a cross-sectional view schematically showing a step of bonding the ink passage member and the nozzle plate in the example of the method for manufacturing the ink jet head shown in FIG. 2.

Next, as shown in FIG. 9B, the ink passage member C is bonded to the nozzle plate D so that each ink passage 107 is aligned over the corresponding nozzle hole 108 when viewed from the direction perpendicular to the main surface of the ink passage member C. Thus, a combined member is obtained. Preferably, the nozzle hole 108 is fully exposed to the ink passage 107. The method for bonding these two members is not limited, and an adhesive can be used, for example.

Figure 9C:
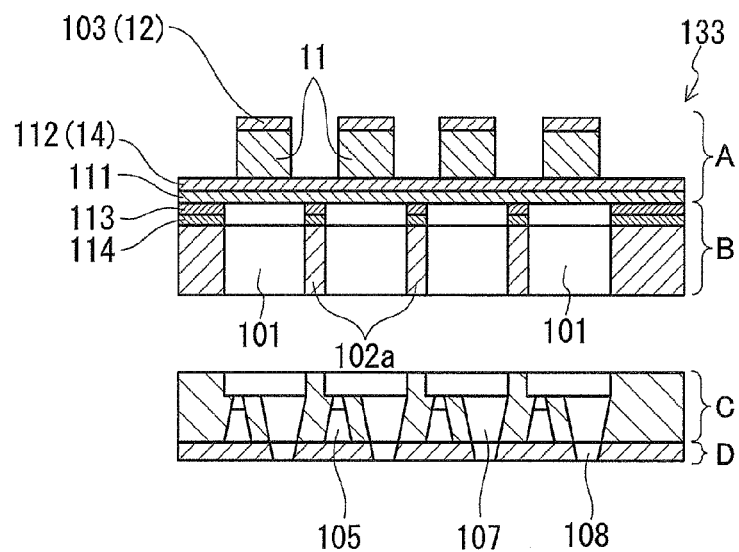
FIG. 9C is a cross-sectional view schematically showing a step of bonding a combined member of the actuator part and the pressure chamber member to a combined member of the ink passage member and the nozzle plate in the example of the method for manufacturing the ink jet head shown in FIG. 2.

Then, as shown in FIG. 9C, the member 133 is bonded to the combined member prepared in the step shown in FIG. 9B. More specifically, the surface of the pressure chamber member A opposite to the actuator part B is bonded to the surface of the ink passage member C opposite to the nozzle plate D. When they are bonded, their alignment is adjusted, and thus this bonding allows the through-holes 101 to function as the pressure chambers 102. The bonding method is not limited, and an adhesive can be used, for example. In this manner, the ink jet head 100 shown in FIG. 9D (FIG. 2) is obtained.

Figure 11:
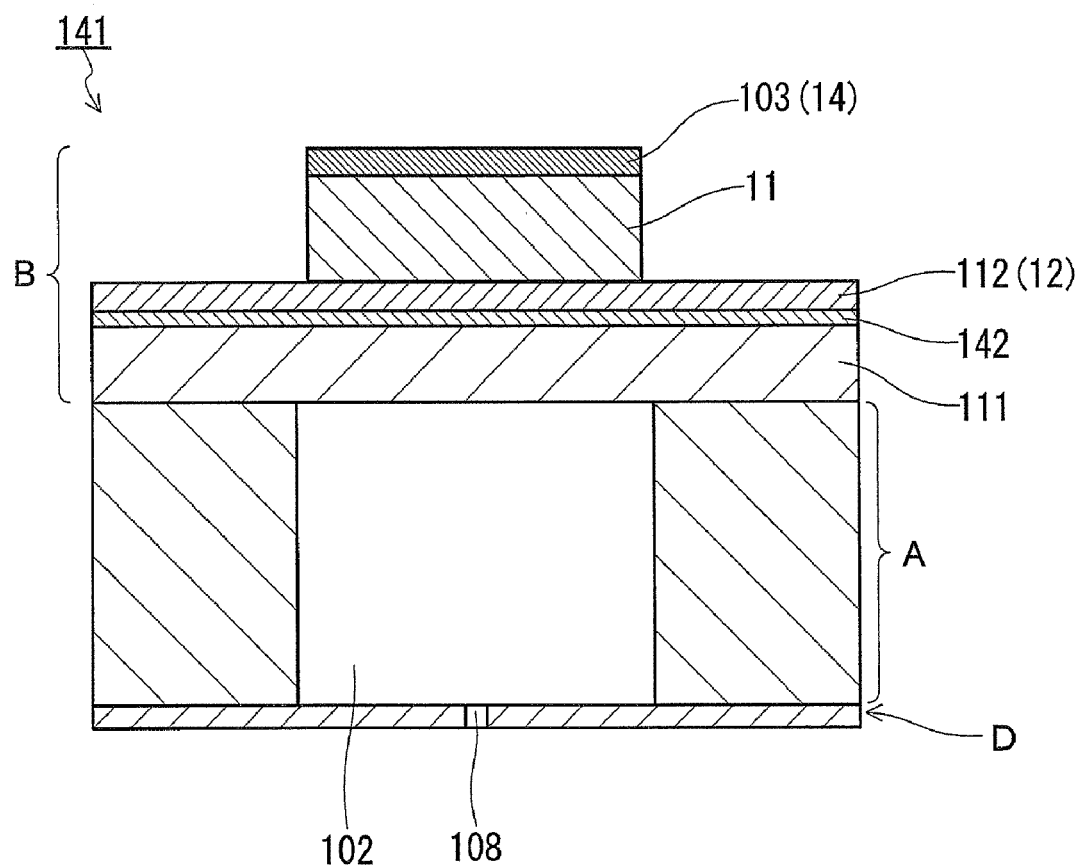
FIG. 11 is a cross-sectional view schematically showing another example of the ink jet head of the present invention.

FIG. 11 shows another ink jet head of the present invention. An ink jet head 141 shown in FIG. 11 has a simpler structure than the ink jet head 100 shown in FIG. 2 to FIG. 4. Specifically, the ink passage member C is removed from the ink jet head 100.

The ink jet head 141 shown in FIG. 11 is the same as the ink jet head 100 shown in FIG. 2 to FIG. 4 except the following points (1) to (6): (1) the ink passage member C is not included, and the nozzle plate D comprising the nozzle hole 108 is bonded directly to the pressure chamber member A; (2) the intermediate layer 113 is not included, and the vibration layer 111 is bonded directly to the pressure chamber member A; (3) an adhesive layer 142 is disposed between the vibration layer 111 and the common electrode layer 112, which improves the adhesion therebetween; (4) the common electrode layer 112 is the LaNiO$_3$ film 12 or a laminate of the LaNiO$_3$ film 12 and another conductive film; (5) the individual electrode layer 103 is the conductive film 14; and (6) the common electrode layer 112, the (Bi, Na, Ba)TiO$_3$ film 11 and the individual electrode layer 103 are laminated in this order from the side of the common electrode layer 112.

The common electrode layer 112 functions as the first electrode. The individual electrode layer 103 functions as the second electrode. The material composing the adhesive layer 142, for example, is Ti.

Figure 12A:
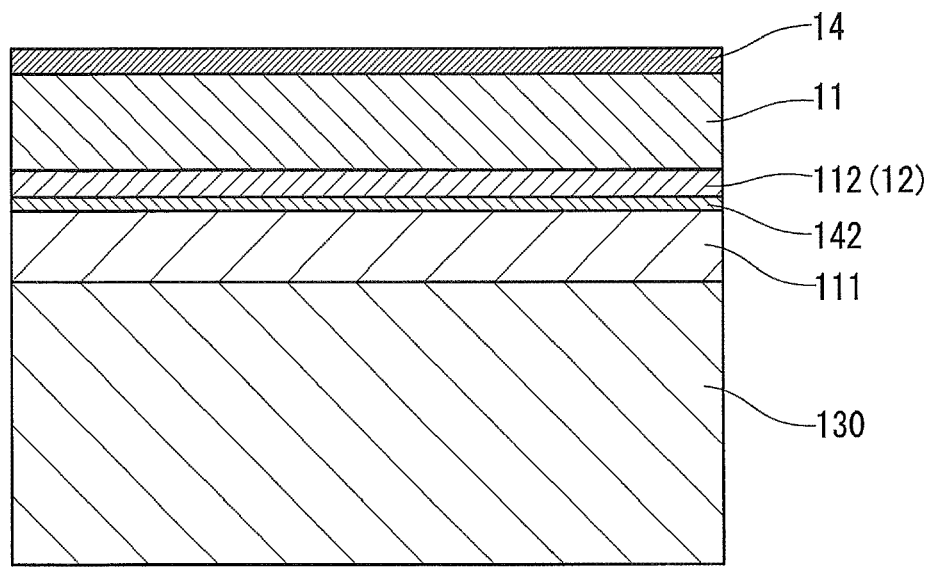
FIG. 12A is a schematic cross-sectional view for illustrating the example of the method for manufacturing the ink jet head shown in FIG. 11.
Figure 12B:
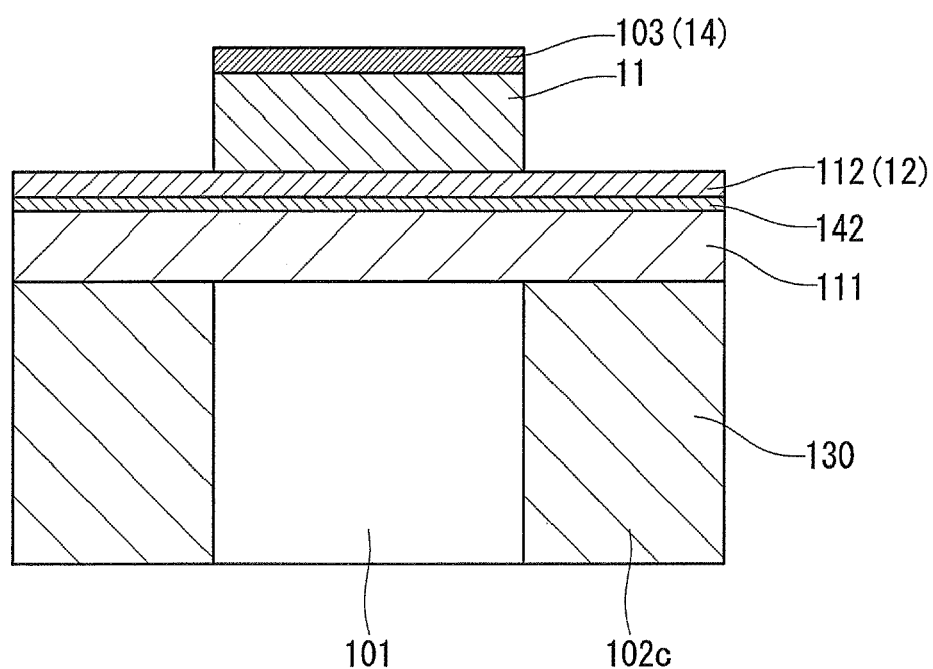
FIG. 12B is a schematic cross-sectional view for illustrating the example of the method for manufacturing the ink jet head shown in FIG. 11.

The ink jet head 141 shown in FIG. 11 can be manufactured, for example, by a method shown in FIG. 12A and FIG. 12B. First, as shown in FIG. 12A, the vibration layer 111, the adhesive layer 142, the common electrode layer 112 (LaNiO$_3$ film 12), the (Bi, Na, Ba)TiO$_3$ film 11 and the conductive film 14 are formed in this order on one main surface of the substrate 130. The technique for forming each layer (film) is as mentioned above. Sputtering is preferably used as the technique.

In this embodiment, in the case where the substrate 130 is made of Si, it is possible to form the vibration layer 111 composed of silicon dioxide by oxidizing the surface of the substrate. In this case, the thickness of the vibration layer 111 can be 0.5 μm to 10 μm.

Next, as shown in FIG. 12B, the through-hole 101 is formed at a position where the pressure chamber 102 is to be formed in the substrate 130. Subsequently, the conductive film 14 and the (Bi, Na, Ba)TiO$_3$ film 11 are subjected to microfabrication so that the center of the through hole 101 coincides with the center of each of the conductive film 14 and the (Bi, Na, Ba)TiO$_3$ film 11 when viewed from the direction perpendicular to the main surface of the substrate 130. The microfabrication allows the conductive film 14 to be transformed into the individual electrode layer 103. A well-known microfabrication technique using a combination of patterning and etching can be used for the formation of the through-hole 101 and the microfabrication of each layer. A resist can be spin-coated for the patterning. As the etching, dry etching is preferable. Anisotropic dry etching is preferable for the formation of the through-hole 101. In dry etching, a gas mixture of argon and an organic gas containing fluorine atoms can be used. In the anisotropic dry etching, the gas mixture can further contain sulfur hexafluoride gas.

Finally, the substrate 130 is bonded to the separately formed nozzle plate having the nozzle hole 108. Thus, the ink jet head 141 shown in FIG. 11 is obtained. When they are bonded, their alignment is adjusted, and thus this bonding allows the through-hole 101 to serve as the pressure chamber 102. The bonding method is not limited, and an adhesive can be used, for example. The nozzle hole 108 can be formed in the nozzle plate by a microfabrication technique such as lithography, laser beam machining and electric discharge machining.

<Method for Forming Image with the Ink Jet Head>

The image forming method of the present invention comprises: in the above-described ink jet head of the present invention, a step of applying a voltage to the piezoelectric layer through the first and second electrodes (that is, the individual electrode layer and the common electrode layer) to displace the vibration layer in the film thickness direction of the vibration layer due to the piezoelectric effect so that the volumetric capacity of the pressure chamber changes, and a step of ejecting the ink from the pressure chamber by the displacement to form an image.

The voltage to be applied to the piezoelectric layer is changed with changing the relative position between the ink jet head and an object on which an image is to be formed, such as paper, to control the timing of ink ejection and the ejection amount of the ink from the ink jet head, so that an image is formed on the surface of the object. The term "image" used in this description includes a character as its meaning. In other words, characters, drawings, graphics, etc. are printed on an object on which they are to be printed, such as paper, by the image forming method of the present invention. This method allows printing with high expressiveness.

<Angular Velocity Sensor>

Figure 13:
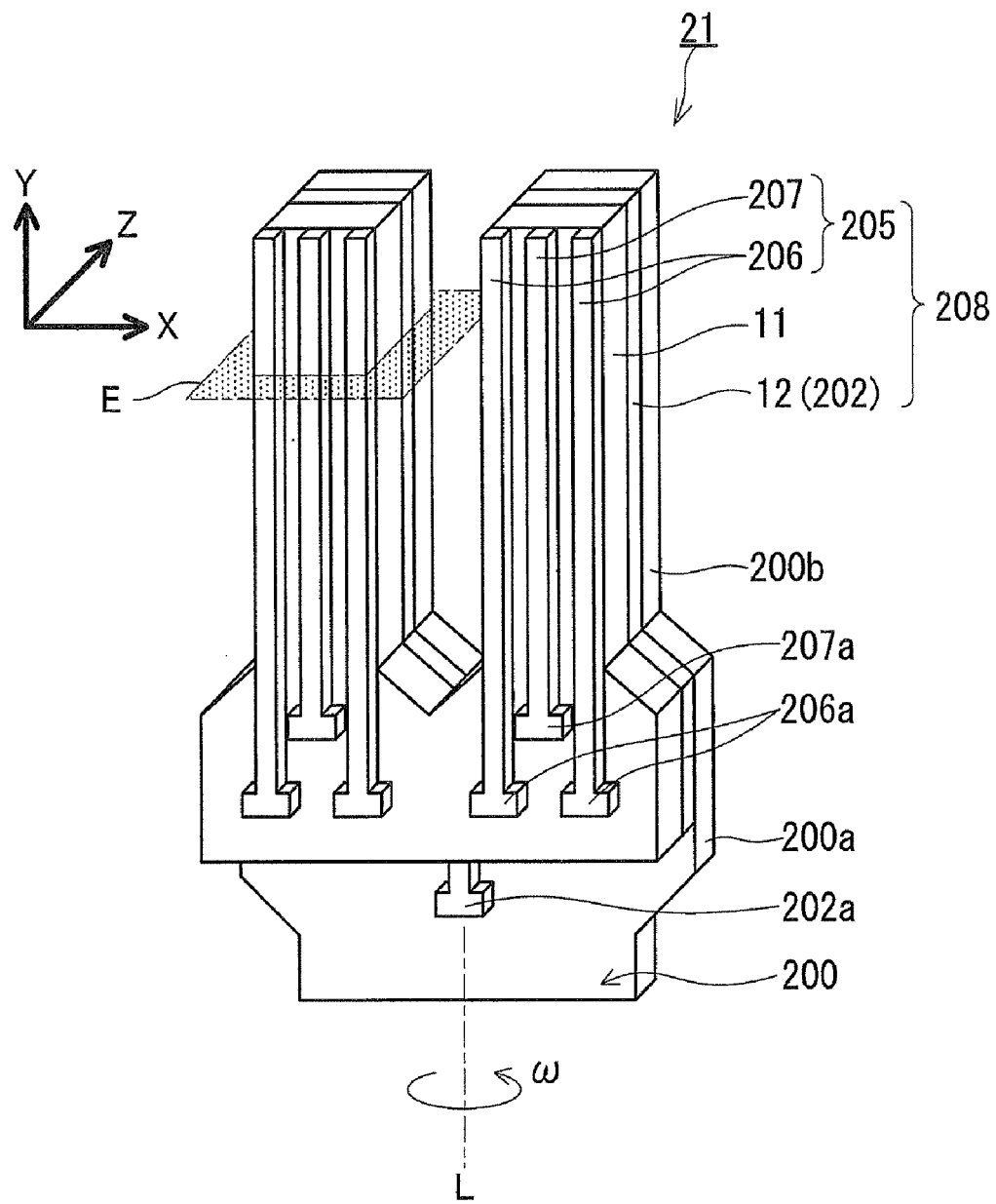
FIG. 13 is a perspective view schematically showing an example of the angular velocity sensor of the present invention.
Figure 14:
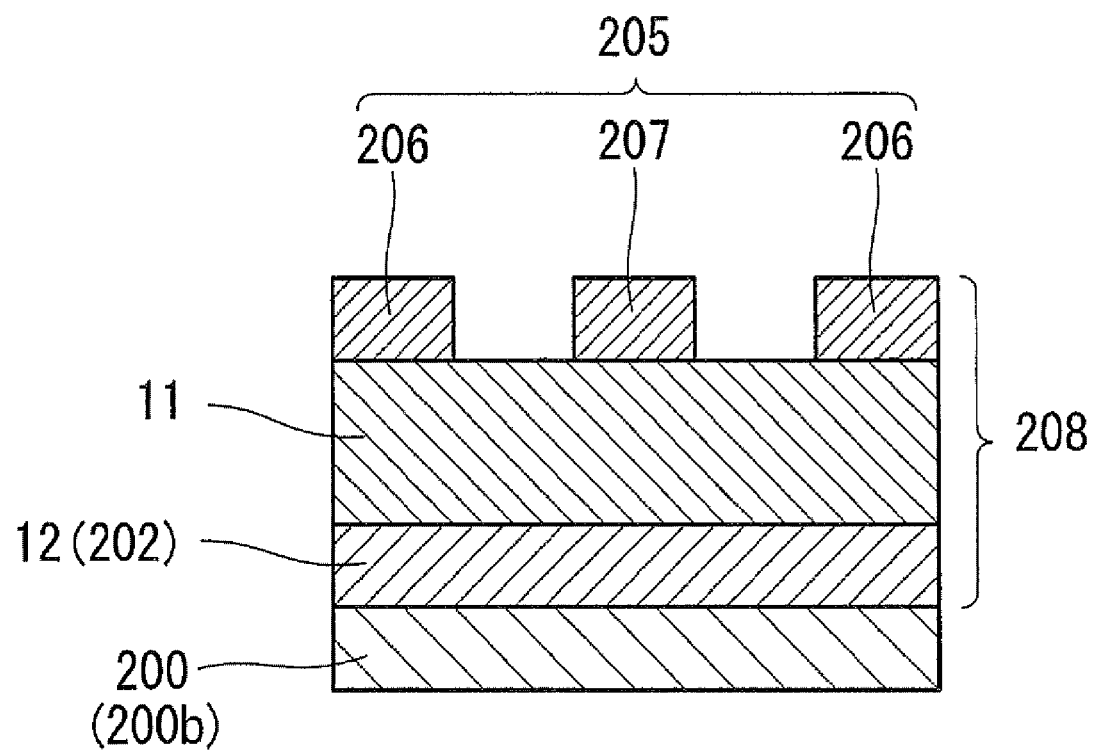
FIG. 14 is a cross-sectional view showing the cross section E of the angular velocity sensor shown in FIG. 13.

FIG. 13 and FIG. 14 show an example of the angular velocity sensor of the present invention. FIG. 14 shows a cross section E of an angular velocity sensor 21 shown in FIG. 13. The angular velocity sensor 21 shown in FIG. 13 and FIG. 14 is a so-called tuning fork-type angular velocity sensor. This type of angular velocity sensor can be used in a navigation apparatus for a vehicle, and as a sensor for correcting image blurring due to hand movement in a digital still camera.

The angular velocity sensor 21 shown in FIG. 13 and FIG. 14 comprises a substrate 200 having vibration parts 200$b$, and a piezoelectric thin film 208 bonded to the vibration parts 200$b$.

The substrate 200 comprises a stationary part 200$a$ and a pair of arms (vibration parts 200$b$) extending in a predetermined direction from the stationary part 200$a$. The extending direction of the vibration parts 200$b$ is the same as the extending direction of the rotational center axis L about which the angular velocity is to be measured by the angular velocity sensor 21. Specifically, it is the Y direction in FIG. 13. The substrate 200 is in the form of a tuning fork having two arms (vibration parts 200$b$), when viewed in the thickness direction of the substrate 200 (the Z direction in FIG. 13).

The material composing the substrate 200 is not limited. This material, for example, is Si, glass, ceramic, or metal. The substrate 200 can be a monocrystalline Si substrate. The thickness of the substrate 200 is not limited as long as the angular velocity sensor 21 can work. More specifically, the thickness of the substrate 200 is at least 0.1 mm but not more than 0.8 mm. The thickness of the stationary part 200$a$ can be different from that of the vibration parts 200$b$.

The piezoelectric thin film 208 is bonded to the vibration parts 200$b$. The piezoelectric thin film 208 comprises the (Bi, Na, Ba)TiO$_3$ film 11 that is a piezoelectric layer, a first electrode 202 and a second electrode 205. The piezoelectric layer 11 is sandwiched between the first electrode 202 and the second electrode 205. The piezoelectric thin film 208 has a multilayer structure in which the first electrode 202, the (Bi, Na, Ba)TiO$_3$ film 11 and the second electrode 205 are laminated in this order.

In the piezoelectric thin film 208 shown in FIG. 13 and FIG. 14, the first electrode 202 is the LaNiO$_3$ film 12 or a laminate of the LaNiO$_3$ film 12 and another conductive film. That is, the first electrode comprises the LaNiO$_3$ film 12. The piezoelectric thin film 208 is identical to the piezoelectric thin film 1$d$ shown in FIG. 1D, taking the second electrode 205 as the conductive film 14. However, the first electrode 202 of the angular velocity sensor of the present invention is not limited to an electrode layer comprising the LaNiO$_3$ film 12. The first electrode 202 can be composed of a material having electrical conductivity.

In the piezoelectric thin film 208 shown in FIG. 13 and FIG. 14, the LaNiO$_3$ film 12, the (Bi, Na, Ba)TiO$_3$ film 11 and the conductive film 14 are basically as described above for the piezoelectric thin film of the present invention, including the preferred embodiments thereof.

The material composing the second electrode 205 is not limited and is Cu, for example. Cu electrodes are preferable because of their excellent adhesion to the (Bi, Na, Ba)TiO$_3$ film 11. The second electrode 205 can be a Pt electrode film or an Au electrode film having an adhesive layer made of a conductive material on its surface. The material composing the adhesive layer, for example, is Ti. Ti has high adhesion to the (Bi, Na, Ba)TiO$_3$ film.

The second electrode 205 comprises an electrode group comprising drive electrodes 206 and a sense electrode 207. The drive electrodes 206 apply a driving voltage that oscillates the vibration part 200$b$ to the piezoelectric layer 11. The sense electrode 207 measures a deformation of the vibration part 200$b$ caused by an angular velocity applied to the vibration part 200$b$. The vibration part 200$b$ normally oscillates in its width direction (the X direction in FIG. 13). More specifically, in the angular velocity sensor shown in FIG. 13 and FIG. 14, a pair of drive electrodes 206 are provided respectively at both edge portions in the width direction of the vibration part 200$b$ along the length direction of the vibration part 200$b$ (the Y direction in FIG. 13). The vibration part 200$b$ may be provided with only one drive electrode 206 lying on one edge portion in the width direction of the vibration part 200$b$. In the angular velocity sensor shown in FIG. 13 and FIG. 14, the sense electrode 207 is provided along the length direction of the vibration part 200$b$ and sandwiched between the pair of drive electrodes 206. A plurality of sense electrodes 207 may be provided on the vibration part 200$b$. A deformation of the vibration part 200$b$ measured by the sense electrode 207 normally is a deflection in the thickness direction thereof (the Z direction in FIG. 13).

In the angular velocity sensor of the present invention, one electrode selected from the first electrode and the second electrode can be composed of an electrode group comprising a drive electrode and a sense electrode. In the angular velocity sensor 21 shown in FIG. 13 and FIG. 14, the second electrode 205 is composed of the electrode group. Different from this angular velocity sensor, the first electrode 202 can be composed of the electrode group. As an example, the second electrode 205, the (Bi, Na, Ba)TiO$_3$ film 11 and the first electrode 202 can be laminated in this order, when viewed from the substrate 200.

Connection terminals 202$a$, 206$a$ and 207$a$ are formed, respectively, at the end of the first electrode 202, at the end of the drive electrode 206 and at the end of the sense electrode 207. The shape and position of the respective connection terminals are not limited. In FIG. 13, the connection terminals are provided on the stationary part 200$a$.

Preferably, the first electrode 202 has a thickness of at least 0.05 μm but not more than 1 μm. In the case where the first electrode 302 is a laminate of the LaNiO$_3$ film 12 and another conductive film, the LaNiO$_3$ film 12 preferably has a thickness of at least 0.05 μm but not more than 0.5 μm. The other conductive film preferably has a thickness of at least 0.05 μm but not more than 0.5 μm. The (Bi, Na, Ba)TiO$_3$ film 11 preferably has a thickness of at least 0.5 μm but not more than 5 μm. The second electrode 205 preferably has a thickness of at least 0.05 μm but not more than 0.5 μm.

In the angular velocity sensor shown in FIG. 13 and FIG. 14, the piezoelectric thin film 208 is bonded to both the vibration part 200$b$ and the stationary part 200$a$. However, the bonding state of the piezoelectric thin film 208 is not limited as long as the piezoelectric thin film 208 can oscillate the vibration part 200$b$ and measure a deformation of the vibration part 200$b$. For example, the piezoelectric thin film 208 may be bonded only to the vibration part 200$b$.

The angular velocity sensor of the present invention may have two or more vibration groups each consisting of a pair of vibration parts 200$b$. Such an angular velocity sensor can function as a biaxial or triaxial angular velocity sensor capable of measuring the angular velocity about a plurality of rotational center axes. The angular velocity sensor shown in FIG. 13 and FIG. 14 has one vibration group consisting of a pair of vibration parts 200$b$.

The angular velocity sensor of the present invention can be manufactured by applying the above-mentioned method for manufacturing the piezoelectric thin film of the present invention, for example, as follows.

First, the LaNiO$_3$ film 12, the (Bi, Na, Ba)TiO$_3$ film 11 and the conductive film 14 are formed on the surface of a substrate (for example, a Si substrate) in this order. The above-mentioned thin film formation techniques can be employed to form each layer (film). Sputtering is preferably used as the technique.

Next, the conductive film 14 is patterned using a microfabrication technique to form the second electrode 205 composed of the drive electrodes 206 and the sense electrode 207. Furthermore, the (Bi, Na, Ba)TiO$_3$ film 11 and the LaNiO$_3$ film 12 are patterned using a microfabrication technique. Then, the substrate is patterned using a microfabrication technique to form the vibration parts 200$b$. In this manner, the angular velocity sensor of the present invention can be manufactured.

The microfabrication technique, for example, is dry etching.

The angular velocity sensor of the present invention can be manufactured by applying a transfer technique using a base substrate. Specifically, the following method can be used, for example. First, the LaNiO$_3$ film 12, the (Bi, Na, Ba)TiO$_3$ film 11 and the conductive film 14 are formed on the surface of a base substrate in this order. Next, the laminate thus formed is bonded to another new substrate so that this substrate and the conductive film 14 are in contact with each other. Subsequently, the base substrate is removed by a well-known technique. Then, each layer (film) is patterned using a microfabrication technique. Thus, the angular velocity sensor of the present invention can be manufactured. The laminate and the new substrate can be bonded, for example, via an adhesive layer. The material for the adhesive layer is not limited as long as the laminate is bonded stably to the new substrate. More specifically, an acrylic resin adhesive, an epoxy resin adhesive, a silicone adhesive or a polyimide adhesive can be used. In this case, the adhesive layer preferably has a thickness of at least 0.2 μm but not more than 1 μm.

<Method for Measuring Angular Velocity with the Angular Velocity Sensor>

The angular velocity measuring method of the present invention uses the angular velocity sensor of the present invention and comprises: applying a driving voltage to the piezoelectric layer to oscillate a vibration part of the substrate; and measuring a deformation of the vibration part caused by an angular velocity applied to the vibration part that is oscillating to measure the value of the angular velocity. The driving voltage is applied between one (the other electrode) of the first electrode and the second electrode that functions neither as the drive electrode nor as the sense electrode and the drive electrode, and thus the driving voltage is applied to the piezoelectric layer. The other electrode and the sense electrode measure a deformation of the vibration part in the oscillation state caused by the angular velocity.

Hereinafter, the angular velocity measuring method with the angular velocity sensor 21 shown in FIG. 13 is described. A driving voltage having a frequency that resonates with the natural vibration of each vibration part 200$b$ is applied to the (Bi, Na, Ba)TiO$_3$ film 11 that is a piezoelectric layer through the first electrode 202 and the drive electrodes 206 so as to oscillate the vibration part 200$b$. The piezoelectric layer 11 is deformed in accordance with the waveform of the applied driving voltage, and the vibration part 200b bonded to the piezoelectric layer 11 oscillates. The driving voltage can be applied, for example, by grounding the first electrode 202 and changing the potential of the driving electrodes 206 (in other words, the driving voltage is the potential difference between the first electrode 202 and the driving electrodes 206). The angular velocity sensor 21 comprises a pair of vibration parts 200b that are arranged in the form of a tuning fork. Normally, voltages (positive and negative) having phases that are reversed to each other are applied to the drive electrodes 206 provided on each pair of vibration parts 200b. This allows the respective vibration parts 200b to oscillate in the mode in which they vibrate in mutually opposite directions (the mode in which they vibrate symmetrically with respect to the rotational center axis L shown in FIG. 13). In the angular velocity sensor 21 shown in FIG. 13, the vibration parts 200b oscillate in their width direction (the X direction). The angular velocity can be measured by oscillating only one of the pair of vibration parts 200b. However, for accurate measurement, it is preferable to oscillate both of the vibration parts 200b in the mode in which they vibrate in mutually opposite directions.

When an angular velocity ω with respect to the rotational center axis L is applied to the angular velocity sensor 21 in which the vibration parts 200b are oscillating, the vibration parts 200b each are deflected in their thickness direction (the Z direction) by Coriolis force. In the case where the pair of vibration parts 200b are oscillating in the mode in which they vibrate in mutually opposite directions, the respective vibration parts 200b are deflected in the opposite directions by the same degree. The piezoelectric layer 11 bonded to the vibration parts 200b also is deflected in accordance with the deflection of the vibration parts 200b. As a result, a potential difference is generated between the first electrode 202 and the sense electrode 207 in accordance with the deflection of the piezoelectric layer 11, that is, the magnitude of the generated Coriolis force. The angular velocity ω applied to the angular velocity sensor 21 can be measured by measuring the magnitude of the potential difference.

The following relationship is established between the Coriolis force Fc and the angular velocity ω:

$$Fc = 2mv\omega,$$

where v is the velocity in the oscillation direction of the vibration part 200b in the oscillation state, and m is the mass of the vibration part 200b. As shown in this equation, the angular velocity ω can be calculated from the Coriolis force Fc.

<Piezoelectric Generating Element>

Figure 15:
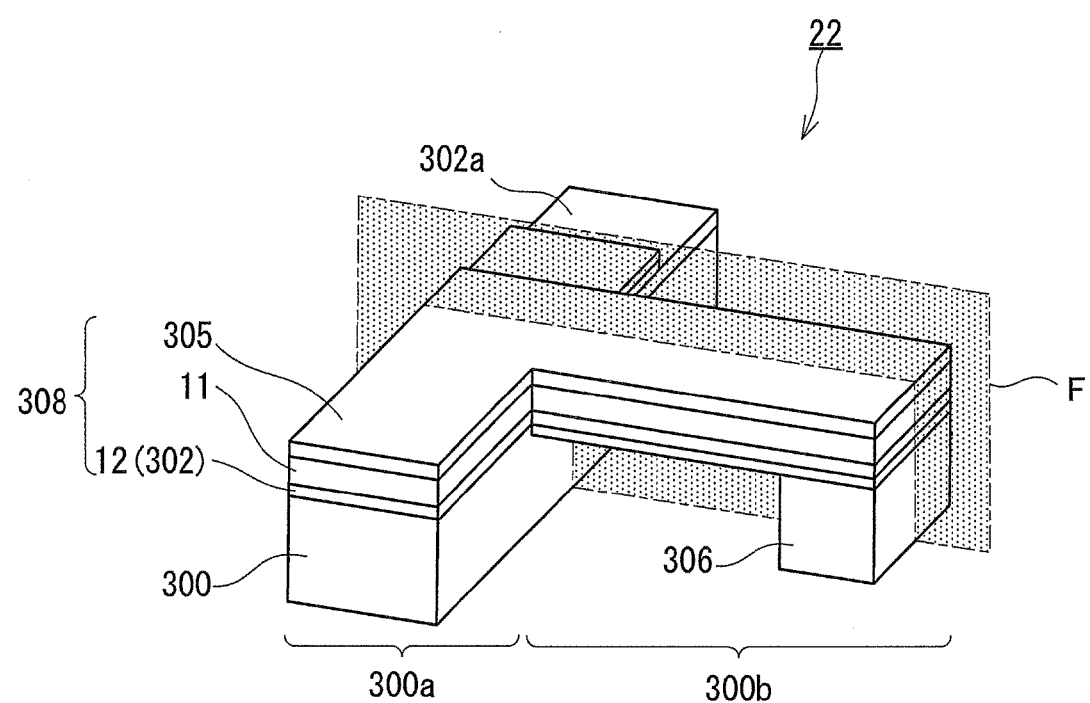
FIG. 15 is a perspective view schematically showing an example of the piezoelectric generating element of the present invention.
Figure 16:
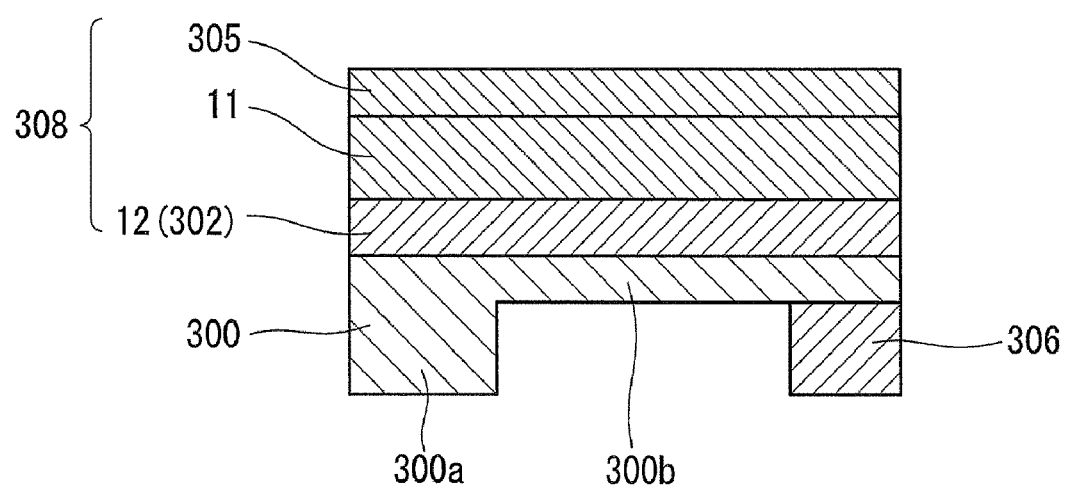
FIG. 16 is a cross-sectional view showing the cross section F of the piezoelectric generating element shown in FIG. 15.

FIG. 15 and FIG. 16 show an example of the piezoelectric generating element of the present invention. FIG. 16 shows a cross section F of a piezoelectric generating element 22 shown in FIG. 15. The piezoelectric generating element 22 is an element that converts an externally applied mechanical vibration into electrical energy. The piezoelectric generating element 22 is applied suitably to a self-sustained power supply for generating electric power from various vibrations including engine vibrations and driving vibrations generated in vehicles and machines and vibrations generated during walking.

The piezoelectric generating element 22 shown in FIG. 15 and FIG. 16 comprises a substrate 300 having a vibration part 300b, and a piezoelectric thin film 308 bonded to the vibration part 300b.

The substrate 300 has a stationary part 300a, and a vibration part 300b composed of a beam extending in a predetermined direction from the stationary part 300a. The material composing the stationary part 300a can be the same as the material composing the vibration part 300b. These materials, however, may be different from each other. The stationary part 300a made of a material different from the vibration part 300b may be bonded to the vibration part 300b.

The material composing the substrate 300 is not limited. This material, for example, is Si, glass, ceramic or metal. The substrate 300 can be a monocrystalline Si substrate. The substrate 300 has a thickness, for example, of at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is joined to the vibration part 300b. The weight load 306 adjusts the resonance frequency of the vibration part 300b. The weight load 306, for example, is a vapor-deposited thin film of Ni. The material, shape and mass of the weight load 306 as well as the position to which the weight load 306 is joined can be adjusted according to the desired resonance frequency of the vibration part 300b. The weight load may be omitted. The weight load is not necessary when the resonance frequency of the vibration part 300b is not to be adjusted.

The piezoelectric thin film 308 is bonded to the vibration part 300b. The piezoelectric thin film 308 comprises the (Bi, Na, Ba)TiO$_3$ film 11 that is a piezoelectric layer, a first electrode 302 and a second electrode 305. The (Bi, Na, Ba)TiO$_3$ film 11 is sandwiched between the first electrode 302 and the second electrode 305. The piezoelectric thin film 308 has a multilayer structure in which the first electrode 302, the (Bi, Na, Ba)TiO$_3$ film 11 and the second electrode 305 are laminated in this order.

In the piezoelectric thin film 308 shown in FIG. 15 and FIG. 16, the first electrode 302 is the LaNiO$_3$ film 12 or a laminate of the LaNiO$_3$ film 12 and another conductive film. That is, the first electrode comprises the LaNiO$_3$ film 12. The piezoelectric thin film 308 is identical to the piezoelectric thin film 1d shown in FIG. 1D, taking the second electrode 305 as the conductive film 14. However, the first electrode 302 of the piezoelectric generating element of the present invention is not limited to an electrode layer comprising the LaNiO$_3$ film 12. The first electrode 302 can be composed of a material having electrical conductivity.

In the piezoelectric thin film 308 shown in FIG. 15 and FIG. 16, the LaNiO$_3$ film 12, the (Bi, Na, Ba)TiO$_3$ film 11 and the conductive film 14 are basically as described above for the piezoelectric thin film of the present invention, including the preferred embodiments thereof.

The second electrode 305, for example, can be a Cu electrode film. A Cu electrode is preferable because of its excellent adhesion to the (Bi, Na, Ba)TiO$_3$ film 11. The second electrode 305 can be a Pt electrode film or an Au electrode film having an adhesive layer made of a conductive material on its surface. The material composing the adhesive layer is Ti, for example. Ti has high adhesion to the (Bi, Na, Ba)TiO$_3$ film.

In the piezoelectric generating element shown in FIG. 15 and FIG. 16, a part of the first electrode 302 is exposed. This part can function as a connection terminal 302a.

Preferably, the first electrode 302 has a thickness of at least 0.05 μm but not more than 1 μm. In the case where the first electrode 302 is a laminate of the LaNiO$_3$ film 12 and another conductive film, the LaNiO$_3$ film 12 preferably has a thickness of at least 0.05 μm but not more than 0.5 μm. The other conductive film preferably has a thickness of at least 0.05 μm but not more than 0.5 μm. The (Bi, Na, Ba)TiO$_3$ film 11 preferably has a thickness of at least 0.5 μm but not more than 5 μm. The second electrode 305 preferably has a thickness of at least 0.05 μm but not more than 0.5 μm.

In the piezoelectric generating element shown in FIG. 15 and FIG. 16, the first electrode 302, the (Bi, Na, Ba)TiO$_3$ film 11 and the second electrode 305 are laminated in this order, when viewed from the side of the substrate 300 having the vibration part 300b. The order of lamination of these layers may be reversed. That is, the second electrode, the (Bi, Na, Ba)TiO$_3$ film and the first electrode can be laminated in this order, when viewed from the side of the substrate having the vibration part.

In the piezoelectric generating element shown in FIG. 15 and FIG. 16, the piezoelectric thin film 308 can be bonded to both of the vibration part 300b and the stationary part 300a. The piezoelectric thin film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations having a wide range of frequency components if the plurality of vibration parts 300b have different resonance frequencies.

The piezoelectric thin film of the present invention can be manufactured by applying the above-mentioned manufacturing method of the piezoelectric thin film of the present invention, for example, as follows.

First, the LaNiO$_3$ film 12, the (Bi, Na, Ba)TiO$_3$ film 11 and the conductive film 14 are formed on the surface of a substrate (for example, a Si substrate) in this order. The above-mentioned thin film formation techniques can be employed to form each layer (film). Sputtering is preferably used as the technique.

Next, the conductive film 14 is patterned using a microfabrication technique to form the second electrode 305. Further, the (Bi, Na, Ba)TiO$_3$ film 11 and the LaNiO$_3$ film 12 are patterned using a microfabrication technique. A connection terminal 302a also can be formed through the patterning of the LaNiO$_3$ film 12. Then, the substrate is patterned using a microfabrication technique to form the stationary part 300a and the vibration part 300b. The piezoelectric generating element of the present invention can be manufactured in this manner. In the case where the resonance frequency of the vibration part 300b needs to be adjusted, the weight load 306 is bonded to the vibration part 300b by a well-known method.

The microfabrication technique, for example, is dry etching.

The piezoelectric generating element of the present invention can be manufactured by applying a transfer technique using a base substrate. Specifically, the following method can be used, for example. First, the LaNiO$_3$ film 12, the (Bi, Na, Ba)TiO$_3$ film 11 and the conductive film 14 are formed on the surface of a base substrate in this order. Next, the laminate thus formed is bonded to another new substrate so that the substrate and the conductive film 14 are in contact with each other. Subsequently, the base substrate is removed by a well-known technique. Then, each layer (film) is patterned using a microfabrication technique. Thus, the piezoelectric generating element of the present invention can be manufactured. The laminate and the new substrate can be bonded, for example, via an adhesive layer. The material for the adhesive layer is not limited as long as the laminate is bonded stably to the new substrate. More specifically, an acrylic resin adhesive, an epoxy resin adhesive, a silicone adhesive or a polyimide adhesive can be used. In this case, the adhesive layer preferably has a thickness of at least 0.2 μm but not more than 1 μm.

<Method for Generating Electrical Power with the Piezoelectric Generating Element>

Vibration is applied to the above-described piezoelectric generating element of the present invention to generate a potential difference between the first electrode and the second electrode, so that electric power can be obtained through the first electrode and the second electrode.

When a mechanical vibration is applied externally to the piezoelectric generating element 22, the vibration part 300b starts vibrating, which produces upward and downward deflections with respect to the stationary part 300a. This vibration generates an electromotive force due to the piezoelectric effect in the (Bi, Na, Ba)TiO$_3$ film 11 that is a piezoelectric layer. As a result, a potential difference is generated between the first electrode 302 and the second electrode 305 that sandwich the piezoelectric layer 11. The higher the piezoelectric performance of the piezoelectric layer 11, the larger the potential difference generated between the first and second electrodes should be. Particularly in the case where the resonance frequency of the vibration part 300b is close to the frequency of the mechanical vibration applied externally to the element, the amplitude of the vibration part 300b increases and thus the electric power generation characteristics are improved. Therefore, it is preferable that the resonance frequency of the vibration part 300b be adjusted by the weight load 306 so as to be close to the frequency of the mechanical vibration applied externally to the element.

EXAMPLES

Hereinafter, the present invention is described in more detail with reference to examples. The present invention is not limited to the following examples.

Example 1

In Example 1, a piezoelectric thin film that comprises: a substrate 13; a first electrode comprising a LaNiO$_3$ film 12 and another conductive film; a (Bi, Na, Ba)TiO$_3$ film (piezoelectric layer) 11; and a conductive film 14 (second electrode) in this order was produced. This piezoelectric thin film corresponds to the piezoelectric thin film 1e shown in FIG. 1E except that the first electrode was a laminate of the LaNiO$_3$ film 12 and another conductive film. This piezoelectric thin film was produced as follows.

A Pt film (with a thickness of 100 nm) having (111) orientation was formed by RF magnetron sputtering on the surface of a monocrystalline Si substrate having (100) plane orientation. This Pt film corresponds to the other conductive film. The Pt film was formed using a metallic Pt target in an argon (Ar) gas atmosphere under the film formation conditions of an RF power of 15 W and a substrate temperature of 300° C. Before the Pt film was formed, a Ti film (with a thickness of 2.5 nm) had been formed on the surface of the monocrystalline Si substrate to improve the adhesion between the monocrystalline Si substrate and the Pt film. The Ti film was formed in the same manner as the Pt film except that a metallic Ti target was used instead of the metallic Pt target.

Next, a LaNiO$_3$ film (with a thickness of 200 nm) having (001) orientation was formed on the surface of the Pt film by RF magnetron sputtering. The LaNiO$_3$ film was formed using LaNiO$_3$ having a stoichiometric composition as a target in a mixed gas atmosphere of Ar and oxygen (with a flow ratio Ar/O$_2$ of 80/20) under the film formation conditions of an RF power of 100 W and a substrate temperature of 300° C.

Next, a $[(Bi_{0.5}Na_{0.5})TiO_3]_{0.93}$—$[BaTiO_3]_{0.07}$ film (with a thickness of 2.7 μm) containing 0.0025 of Ag in terms of the mole ratio of Ag to Ti was formed on the surface of the LaNiO$_3$ film by RF magnetron sputtering. This film corresponds to the (Bi, Na, Ba)TiO$_3$ film 11. The film 11 was formed using [(Bi$_{0.5}$Na$_{0.5}$)TiO$_3$]$_{0.93}$—[BaTiO$_3$]$_{0.07}$ containing 0.0025 of Ag in terms of the mole ratio of Ag to Ti and having a stoichiometric composition as a target in an atmosphere of a mixed gas of Ar and oxygen (with a flow ratio Ar/O$_2$ of 50/50) under the film formation conditions of an RF power of 170 W and a substrate temperature of 650° C.

Figure 17:
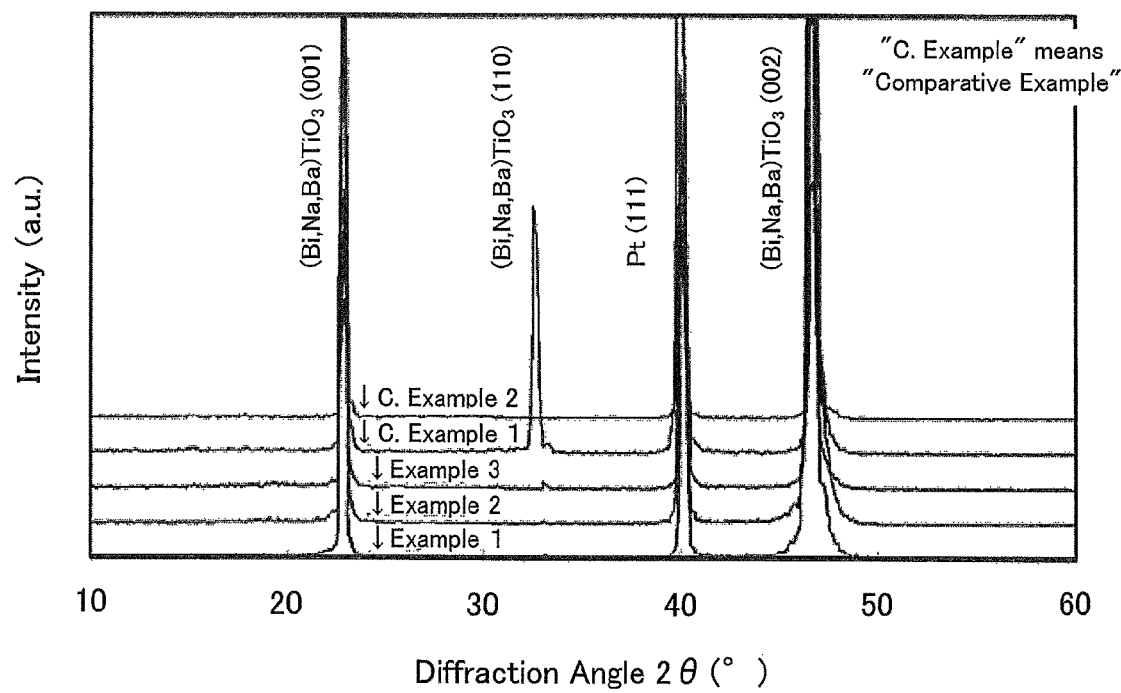
FIG. 17 is a diagram showing the X-ray diffraction profiles of the piezoelectric thin films fabricated as Examples and Comparative Examples.

The crystal structure of the (Bi, Na, Ba)TiO$_3$ film thus formed was analyzed by X-ray diffraction. The X-ray diffraction was carried out by allowing X-rays to be incident on the (Bi, Na, Ba)TiO$_3$ film. FIG. 17 shows the results. The same X-ray diffraction was applied to the later-mentioned comparative examples.

FIG. 17 shows the obtained X-ray diffraction profile. Except for reflection peaks derived from the Si substrate and the Pt film, only a reflection peak derived from the (Bi, Na, Ba)TiO$_3$ film having (001) orientation was observed therein. The intensity of the (001) reflection peak was 6,576 cps, which was very high. The profile shown in FIG. 17 demonstrated that the (Bi, Na, Ba)TiO$_3$ film produced in Example 1 had exceptionally high (001) orientation.

Next, an Au film (with a thickness of 100 nm) was formed on the surface of the (Bi, Na, Ba)TiO$_3$ film by vapor deposition. The Au film corresponds to the conductive film 14. In this way, the piezoelectric thin film of Example 1 was produced.

Figure 18:
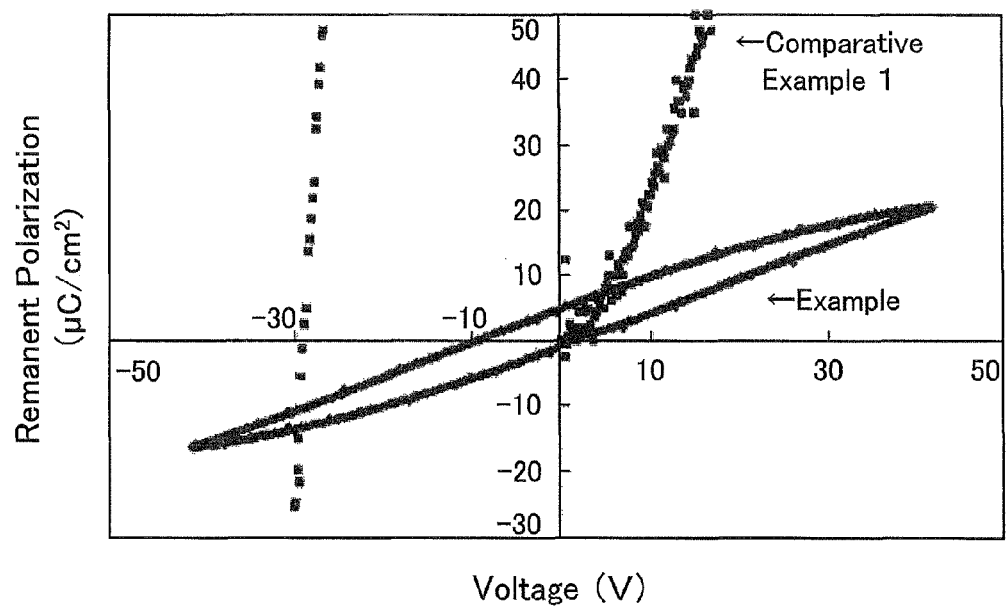
FIG. 18 is a diagram showing P-E hysteresis loops of the piezoelectric thin films fabricated in Example and Comparative Example 1.

Using the Pt film and the Au film comprised in the piezoelectric thin film, the ferroelectric properties (the piezoelectric constant d$_{31}$, the dielectric loss tan δ and the electromechanical coupling coefficient k$_{31}$) of the piezoelectric thin film were determined. FIG. 18 shows the P-E hysteresis loop of the piezoelectric thin film of this example. As shown in FIG. 18, it was confirmed that the piezoelectric thin film exhibited better ferroelectric properties with an increase in the voltage applied to the piezoelectric layer through the Pt film and the Au film. The dielectric loss (tan δ) at 1 kHz was measured using an impedance analyzer. The tan δ of the piezoelectric thin film was 4.7%.

The piezoelectric performance of the piezoelectric thin film was determined as follows. The piezoelectric thin film was cut to a width of 2 mm and formed into a cantilever. Next, a potential difference was applied between the Pt film and the Au film so that the cantilever was displaced. The resulting displacement was measured with a laser displacement meter. Then, the measured displacement was converted into the piezoelectric constant d$_{31}$, and the piezoelectric performance was determined from the piezoelectric constant d$_{31}$. The d$_{31}$ of the piezoelectric thin film produced in Example 1 was −96 pC/N, and the electromechanical coupling coefficient k$_{31}$ thereof was 0.42. The piezoelectric thin film produced in Example 1 sufficiently satisfied the required piezoelectric performance (a d$_{31}$ of −70 pC/N or less, a tan δ of 5.0% or less and a k$_{31}$ of 0.30 or more).

Example 2

In Example 2, a piezoelectric thin film was produced in the same manner as in Example 1 except that the content of Ag in the (Bi, Na, Ba)TiO$_3$ film was set to 0.001 in terms of the mole ratio of Ag to Ti. As a target for forming the (Bi, Na, Ba)TiO$_3$ film, [(Bi$_{0.5}$Na$_{0.5}$)TiO$_3$]$_{0.93}$—[BaTiO$_3$]$_{0.07}$ containing 0.001 of Ag in terms of the mole ratio of Ag to Ti and having a stoichiometric composition was used.

The piezoelectric thin film thus produced was examined in the same manner as in Example 1.

FIG. 17 shows the obtained X-ray diffraction profile of the produced piezoelectric thin film. Except for reflection peaks derived from the Si substrate and the Pt film, only a reflection peak derived from the (Bi, Na, Ba)TiO$_3$ film having (001) orientation was observed. The intensity of the (001) reflection peak was 6,929 cps, which was very high. The profile shown in FIG. 17 demonstrated that the (Bi, Na, Ba)TiO$_3$ film produced in Example 2 had exceptionally high (001) orientation.

The piezoelectric thin film produced in Example 2 exhibited better ferroelectric properties with an increase in the voltage applied to the piezoelectric layer through the Pt film and the Au film in the determination of the P-E hysteresis loop. The piezoelectric constant d$_{31}$ of the piezoelectric thin film produced in Example 2 was −78 pC/N, the dielectric loss tan δ thereof was 4.9%, and the electromechanical coupling coefficient k$_{31}$ thereof was 0.30. The piezoelectric thin film produced in Example 2 satisfied the required piezoelectric performance (a d$_{31}$ of −70 pC/N or less, a tan δ of 5.0% or less and a k$_{31}$ of 0.30 or more).

Example 3

In Example 3, a piezoelectric thin film was produced in the same manner as in Example 1 except that the content of Ag in the (Bi, Na, Ba)TiO$_3$ film was set to 0.01 in terms of the mole ratio of Ag to Ti. As a target for forming the (Bi, Na, Ba)TiO$_3$ film, [(Bi$_{0.5}$Na$_{0.5}$)TiO$_3$]$_{0.93}$—[BaTiO$_3$]$_{0.07}$ containing 0.01 of Ag in terms of the mole ratio of Ag to Ti and having a stoichiometric composition was used.

The piezoelectric thin film thus produced was examined in the same manner as in Example 1.

FIG. 17 shows the obtained X-ray diffraction profile of the produced piezoelectric thin film. Except for reflection peaks derived from the Si substrate and the Pt film, only a reflection peak derived from the (Bi, Na, Ba)TiO$_3$ film having (001) orientation was observed. The intensity of the (001) reflection peak was 3,157 cps, which was high. The profile shown in FIG. 17 demonstrated that the (Bi, Na, Ba)TiO$_3$ film produced in Example 3 had high (001) orientation.

The piezoelectric thin film produced in Example 3 exhibited better ferroelectric properties with an increase in the voltage applied to the piezoelectric layer through the Pt film and the Au film. The d$_{31}$ of the piezoelectric thin film produced in Example 3 was −70 pC/N, the dielectric loss tan δ thereof was 4.8%, and the electromechanical coupling coefficient k$_{31}$ thereof was 0.30. The piezoelectric thin film produced in Example 2 satisfied the required piezoelectric performance (a d$_{31}$ of −70 pC/N or less, a tan δ of 5.0% or less and a k$_{31}$ of 0.30 or more).

Comparative Example 1

In Comparative Example 1, a piezoelectric thin film was produced in the same manner as in Example 1 except that a (Bi, Na, Ba)TiO$_3$ film containing no Ag was formed. As a target for forming the (Bi, Na, Ba)TiO$_3$ film, [(Bi$_{0.5}$Na$_{0.5}$)TiO$_3$]$_{0.93}$—[BaTiO$_3$]$_{0.07}$ containing no Ag and having a stoichiometric composition was used.

The piezoelectric thin film thus produced was examined in the same manner as in Example 1.

FIG. 17 shows the obtained X-ray diffraction profile of the produced piezoelectric thin film. Also in Comparative Example 1 in which the (Bi, Na, Ba)TiO$_3$ film contains no Ag, a reflection peak derived from the (Bi, Na, Ba)TiO$_3$ film having (001) orientation was observed. However, other than that, another reflection peak derived from (110) orientation of the (Bi, Na, Ba)TiO$_3$ film was observed. The intensity of the (001) reflection peak was 2,661 cps, which was significantly lower than that in Example 1. The profile shown in FIG. 17 demonstrated that the (Bi, Na, Ba)TiO$_3$ film produced in Comparative Example 1 had poor (001) orientation.

Although it was tried to determine the P-E hysteresis loop of the piezoelectric thin film produced in Comparative Example 1, it was difficult to determine the loop accurately (see FIG. 18) due to the very significant dielectric loss (with a tan δ of 40%). Also in the determination of the ferroelectric properties, it was difficult to determine the properties accurately due to the large leak current. The piezoelectric constant d$_{31}$ of the piezoelectric thin film produced in Comparative Example 1 was estimated to be about −40 pC/N, and the electromechanical coupling coefficient k$_{31}$ thereof was estimated to be about 0.10. The piezoelectric thin film produced in Comparative Example 1 failed to satisfy the required piezoelectric performance (a d$_{31}$ of −70 pC/N or less, a tan δ of 5.0% or less and a k$_{31}$ of 0.30 or more).

Comparative Example 2

In Comparative Example 2, a piezoelectric thin film was produced in the same manner as in Example 1 except that the content of Ag in the (Bi, Na, Ba)TiO$_3$ film was set to 0.03 in terms of the mole ratio of Ag to Ti. As a target for forming the (Bi, Na, Ba)TiO$_3$ film, [(Bi$_{0.5}$Na$_{0.5}$)TiO$_3$]$_{0.93}$—[BaTiO$_3$]$_{0.07}$ containing 0.03 of Ag in terms of the mole ratio of Ag to Ti and having a stoichiometric composition was used.

The piezoelectric thin film thus produced was examined in the same manner as in Example 1.

FIG. 17 shows the obtained X-ray diffraction profile of the produced piezoelectric thin film. Except for reflection peaks derived from the Si substrate and the Pt film, only a reflection peak derived from the (Bi, Na, Ba)TiO$_3$ film having (001) orientation was observed in Comparative Example 2. However, the intensity of the (001) reflection peak was 1,339 cps, which was significantly lower than that in Example 1. The profile shown in FIG. 17 demonstrated that the (Bi, Na, Ba)TiO$_3$ film produced in Comparative Example 2 had poor (001) orientation.

Although it was tried to determine the P-E hysteresis loop of the piezoelectric thin film produced in Comparative Example 2, it was difficult to determine the loop accurately due to the very significant dielectric loss (with a tan δ of 26.3%). The piezoelectric constant d$_{31}$ of the piezoelectric thin film produced in Comparative Example 2 was −49 pC/N, and the electromechanical coupling coefficient k$_{31}$ thereof was 0.19. The piezoelectric thin film produced in Comparative Example 2 failed to satisfy the required piezoelectric performance (a d$_{31}$ of −70 pC/N or less, a tan δ of 5.0% or less and a k$_{31}$ of 0.30 or more).

Table 1 below summarizes the determination results of Examples and Comparative Examples.

TABLE 1

| | | Crystal orientation of piezoelectric layer (XRD analysis) | | | | |
|---|---|---|---|---|---|---|
| | Mole ratio Ag/Ti in piezoelectric layer | Plane orientation where a peak was observed | Peak intensity of (001) plane orientation (cps) | Dielectric loss (%) | Piezoelectric constant d$_{31}$ (pC/N) | Electromechanical coupling coefficient k$_{31}$ |
| Ex. 1 | 0.0025 | (001) | 6,576 | 4.7 | −96 | 0.42 |
| Ex. 2 | 0.0010 | (001) | 6,929 | 4.9 | −78 | 0.30 |
| Ex. 3 | 0.0100 | (001) | 3,157 | 4.8 | −70 | 0.30 |
| C. Ex. 1 | 0 | (001) and (110) | 2,661 | 40 | −40 | 0.10 |
| C. Ex. 2 | 0.0300 | (001) | 1,339 | 26.3 | −49 | 0.19 |

As shown in Table 1, in order to form a (Bi, Na, Ba)TiO$_3$ thin film having strong crystal orientation in the (001) plane direction, addition, to the film, of 0.001 to 0.01 of Ag in terms of the mole ratio of Ag to Ti was useful. When 0.001 to 0.01 of Ag in terms of the mole ratio of Ag to Ti was added to the (Bi, Na, Ba)TiO$_3$ film, a lead-free piezoelectric thin film having low dielectric loss, high electromechanical coupling coefficient and high piezoelectric constant comparable to PZT was achieved.

The present invention may be embodied in other forms without departing from the spirit or essential characteristics thereof. The embodiments described in this specification are to be considered in all respects only as illustrative and not restrictive. The scope of the invention is, therefore, indicated by the appended claims rather than by the foregoing description. All changes which come within the meaning and range of equivalency of the claims are to be embraced within their scope.

INDUSTRIAL APPLICABILITY

The piezoelectric thin film of the present invention exhibits excellent piezoelectric performance, in spite of containing no lead, by controlling the crystal orientation of the (Bi, Na, Ba)TiO$_3$ thin film that is a piezoelectric layer into the (001) direction. That is, the piezoelectric thin film of the present invention simultaneously satisfies all the following piezoelectric properties: (a) a piezoelectric constant d31 of −70 pC/N or less (high displacement), (b) a dielectric loss tan δ of 5.0% or less (low energy loss), and (c) an electromechanical coupling coefficient k31 of 0.30 or more (high energy conversion efficiency).

The piezoelectric thin film of the present invention is useful as a piezoelectric thin film alternative to existing lead-containing oxide ferroelectrics. The piezoelectric thin film of the present invention can be used suitably for applications such as pyroelectric sensors and piezoelectric devices in which a piezoelectric thin film is used. Examples of such applications include the ink jet head, the angular velocity sensor and the piezoelectric generating element of the present invention.

The ink jet head of the present invention has excellent ink ejection characteristics although it does not contain a lead-containing ferroelectric material such as PZT. The method for forming an image with this ink jet head has high image forming accuracy and high expressiveness. The angular velocity sensor of the present invention has high sensitivity although it does not contain a lead-containing ferroelectric material such as PZT. The method for measuring an angular velocity with this angular velocity sensor has excellent measurement sensitivity. The piezoelectric generating element of the present invention has excellent electric power generation characteristics although it does not contain a lead-containing ferroelectric material such as PZT. The method of the present invention for generating electric power with this piezoelectric generating element has high electric power generation efficiency. The ink jet head, the angular velocity sensor and the piezoelectric generating element, and the image forming method, the angular velocity measurement method and the electric power generation method, according to the present invention, can be widely applied to various fields and uses.

What is claimed is:

1. A method for measuring an angular velocity with an angular velocity sensor, the method comprising:
    preparing the angular velocity sensor, wherein
        the angular velocity sensor comprises: a substrate having a vibration part; and a piezoelectric thin film having a piezoelectric layer,
        the piezoelectric thin film further has a first electrode and a second electrode that sandwich the piezoelectric layer and is bonded to the vibration part,
        the piezoelectric layer is a (Bi, Na, Ba)TiO$_3$ film composed of a perovskite composite oxide (Bi, Na, Ba)TiO$_3$,
        the (Bi, Na, Ba)TiO$_3$ film has (001) orientation and further contains Ag,
        the (Bi, Na, Ba)TiO$_3$ film has a mole ratio of Ag to Ti of at least 0.001 but not more than 0.01, and
        one electrode selected from the first electrode and the second electrode is composed of an electrode group comprising a drive electrode and a sense electrode;
    applying a driving voltage to the piezoelectric layer through the drive electrode and the other of the first electrode and the second electrode selected therefrom to oscillate the vibration part; and
    measuring, through the other electrode and the sense electrode, a deformation of the vibration part caused by an angular velocity applied to the vibration part that is oscillating to measure a value of the applied angular velocity.

2. The method according to claim 1, wherein the first electrode comprises a LaNiO$_3$ film having (001) orientation.

3. The method according to claim 1, wherein the substrate is a Si substrate.

* * * * *